United States Patent
Ujita et al.

(10) Patent No.: US 9,654,001 B2
(45) Date of Patent: May 16, 2017

(54) SEMICONDUCTOR DEVICE

(71) Applicant: Panasonic Intellectual Property Management Co., Ltd., Osaka (JP)

(72) Inventors: Shinji Ujita, Osaka (JP); Tatsuo Morita, Tokyo (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 28 days.

(21) Appl. No.: 14/918,517

(22) Filed: Oct. 20, 2015

(65) Prior Publication Data

US 2016/0043643 A1 Feb. 11, 2016

Related U.S. Application Data

(63) Continuation of application No. PCT/JP2014/002062, filed on Apr. 10, 2014.

(30) Foreign Application Priority Data

May 20, 2013 (JP) .................................. 2013-105797

(51) Int. Cl.
*H01L 29/778* (2006.01)
*H02M 3/158* (2006.01)
(Continued)

(52) U.S. Cl.
CPC ........ *H02M 3/158* (2013.01); *H01L 23/4824* (2013.01); *H01L 23/535* (2013.01);
(Continued)

(58) Field of Classification Search
CPC ............. H01L 29/778; H01L 29/41725; H01L 27/0207; H01L 23/535
See application file for complete search history.

(56) References Cited

U.S. PATENT DOCUMENTS 5,461,259 A * 10/1995 Kitamura .............. H01L 27/088
257/401
7,863,877 B2 1/2011 Briere
(Continued)

FOREIGN PATENT DOCUMENTS

| JP | 7-074185 | 3/1995 |
|---|---|---|
| JP | 2001-326333 | 11/2001 |
| JP | 2012-089793 | 5/2012 |

OTHER PUBLICATIONS

International Search Report of PCT application No. PCT/JP2014/002062 dated Jul. 15, 2014.

*Primary Examiner* — Michele Fan
(74) *Attorney, Agent, or Firm* — McDermott Will & Emery LLP

(57) ABSTRACT

A semiconductor device includes a semiconductor layer laminate disposed on a semiconductor substrate, a first and a second low-side transistors, and a first and a second high-side transistors. Each of the transistors is disposed on the semiconductor layer laminate, and includes a gate electrode, a source electrode, and a drain electrode. The second low-side transistor is disposed between the first low-side transistor and the first high-side transistor, and the first high-side transistor is disposed between the second low-side transistor and the second high-side transistor. The source electrodes of the first and the second low-side transistors are combined into one source electrode, the drain electrodes of the first and the second high-side transistors are combined into one drain electrode, and the drain electrode of the second low-side transistor and the source electrode of the first high-side transistor are combined into one first electrode.

14 Claims, 28 Drawing Sheets

(51) Int. Cl.
*H01L 27/02* (2006.01)
*H01L 27/088* (2006.01)
*H01L 29/417* (2006.01)
*H01L 29/20* (2006.01)
*H01L 23/482* (2006.01)
*H01L 23/535* (2006.01)
*H01L 29/10* (2006.01)
*H01L 27/06* (2006.01)

(52) U.S. Cl.
CPC ........ *H01L 27/0207* (2013.01); *H01L 27/088* (2013.01); *H01L 29/2003* (2013.01); *H01L 29/41758* (2013.01); *H01L 29/7786* (2013.01); *H01L 27/0605* (2013.01); *H01L 29/1066* (2013.01); *H01L 2924/0002* (2013.01)

(56) References Cited

U.S. PATENT DOCUMENTS

| | | | |
|---|---|---|---|
| 8,427,235 B2 * | 4/2013 | Williams | H01L 24/49 330/207 A |
| 2005/0189562 A1 * | 9/2005 | Kinzer | H01L 27/0605 257/192 |
| 2012/0091986 A1 * | 4/2012 | Takemae | H01L 21/8252 323/311 |
| 2012/0098038 A1 | 4/2012 | Shono | |

* cited by examiner

In case where N = 3

In case where N = 3

In case where N = 3

In case where N = 3

In case where N = 3

In case where N = 3

In case where N = 3

In case where N = 3

In case where N = 3

In case where N = 3

Electrode lead wire serving as first gate electrode lead wire 109 of first composite half-bridge cell 168 and first gate electrode lead wire 109 of second composite half-bridge cell 169

Electrode lead wire serving as second gate electrode lead wire 119 of second composite half-bridge cell 169 and second gate electrode lead wire 119 of third composite half-bridge cell 170

In case where N = 3 × 3

In case where N = 3 × 3

In case where N = 3 × 3

In case where N = 3 × 3

In case where N = 3 × 3

SEMICONDUCTOR DEVICE

BACKGROUND OF THE INVENTION

1. Field of the Invention

The present technology relates to a semiconductor device to be used as a switching element of a power supply circuit, and more particularly to a technique for effectively improving power conversion efficiency, and miniaturization.

2. Description of the Related Art

In recent years, a power conversion device represented by a high-power supply circuit has been expected to reduce a power loss and improve power conversion efficiency. In particular, a DC-DC converter which is used in a power supply circuit in a personal computer or a stationary game machine tends to output a large current to drive a central processing unit at high speed. Therefore, it is a great issue to improve the power conversion efficiency.

The DC-DC converter is comprised of a high-side switch and a low-side switch, and each switch is made of a power semiconductor. Thus, the power conversion is performed by alternately turning ON/OFF the high-side switch and the low-side switch in synchronization with each other. The high-side switch is a control switch, and the low-side switch is a synchronous rectifying switch in the DC-DC converter.

In a case where each of the high-side switch and the low-side switch is comprised of one package, a parasitic inductance is generated due to wire bonding of the semiconductor device, or a wiring of the package to be mounted on a printed substrate. In particular, when a main current flows through the parasitic inductance on a side of a source terminal of the high-side switch, induced electromotive force is generated. Thus, the turn-on of the high-side switch is delayed, which causes power conversion efficiency to be lowered.

Thus, as one technique to improve the power conversion efficiency of the DC-DC converter, Patent Literature 1 discloses a technique to reduce an influence of the parasitic inductance due to the wire bonding or the wiring of the package.

Patent Literature 1 discloses the technique to improve the power conversion efficiency of the DC-DC converter by integrating the high-side switch and the low-side switch into one chip. More specifically, the high-side switch and the low-side switch are not provided as discrete components, but integrated into the one chip to eliminate a wire for connecting the switch and a wiring on a mounting substrate. Furthermore, the integration into the one chip can considerably reduce a module size.

CITATION LIST

Patent Literature

PL1: U.S. Pat. No. 7,863,877

However, as described above, the DC-DC converter is required to output a large current, so that in order to reduce on-resistance which causes a conductor loss, a gate width Wg in the low-side switch needs to be increased especially. In general, the gate width Wg of the low-side switch needs to be 1000 mm or more. Therefore, when the switches are integrated into the one chip together with a gate drive circuit, a size needs to be 3 $mm^2$ to 4 $mm^2$.

According to the technique disclosed in Patent Literature 1, a minimal distance between the high-side switch and the low-side switch can be considerably reduced, but an parasitic inductance remains in a part having a relatively long distance between both switches.

SUMMARY OF THE INVENTION

In view of the above problems, an object of the present technology is, in a semiconductor device including a DC-DC converter having a half-bridge configuration composed of a high-side switch and a low-side switch, to reduce a parasitic inductance between the high-side switch and the low-side switch.

A semiconductor device according to one aspect of the present technology includes a semiconductor layer laminate disposed on a semiconductor substrate, a first low-side transistor disposed on the semiconductor layer laminate and having a gate electrode, a source electrode, and a drain electrode, a second low-side transistor disposed on the semiconductor layer laminate and having a gate electrode, a source electrode, and a drain electrode, a first high-side transistor disposed on the semiconductor layer laminate and having a gate electrode, a source electrode, and a drain electrode, and a second high-side transistor disposed on the semiconductor layer laminate and having a gate electrode, a source electrode, and a drain electrode. The second low-side transistor is disposed between the first low-side transistor and the first high-side transistor. The first high-side transistor is disposed between the second low-side transistor and the second high-side transistor. The source electrode of the first low-side transistor and the source electrode of the second low-side transistor are combined into one source electrode. The drain electrode of the first high-side transistor and the drain electrode of the second high-side transistor are combined into one drain electrode. The drain electrode of the second low-side transistor and the source electrode of the first high-side transistor are combined into one first electrode.

According to the semiconductor device in the present technology, it is possible to reduce a parasitic inductance between the high-side transistor and the low-side transistor in the half-bridge configuration, so that efficiency of the DC-DC converter can be improved.

DETAILED DESCRIPTION OF THE PREFERRED EMBODIMENTS

Hereinafter, exemplary embodiments will be described with reference to the drawings. Substantially the same component is marked with the same reference and its description is occasionally omitted. Furthermore, the present technology is not limited to the following exemplary embodiments. Furthermore, different exemplary embodiments can be combined with each other.

First Exemplary Embodiment

A semiconductor device according to the first exemplary embodiment will be described with reference to the drawings.

Figure 1:
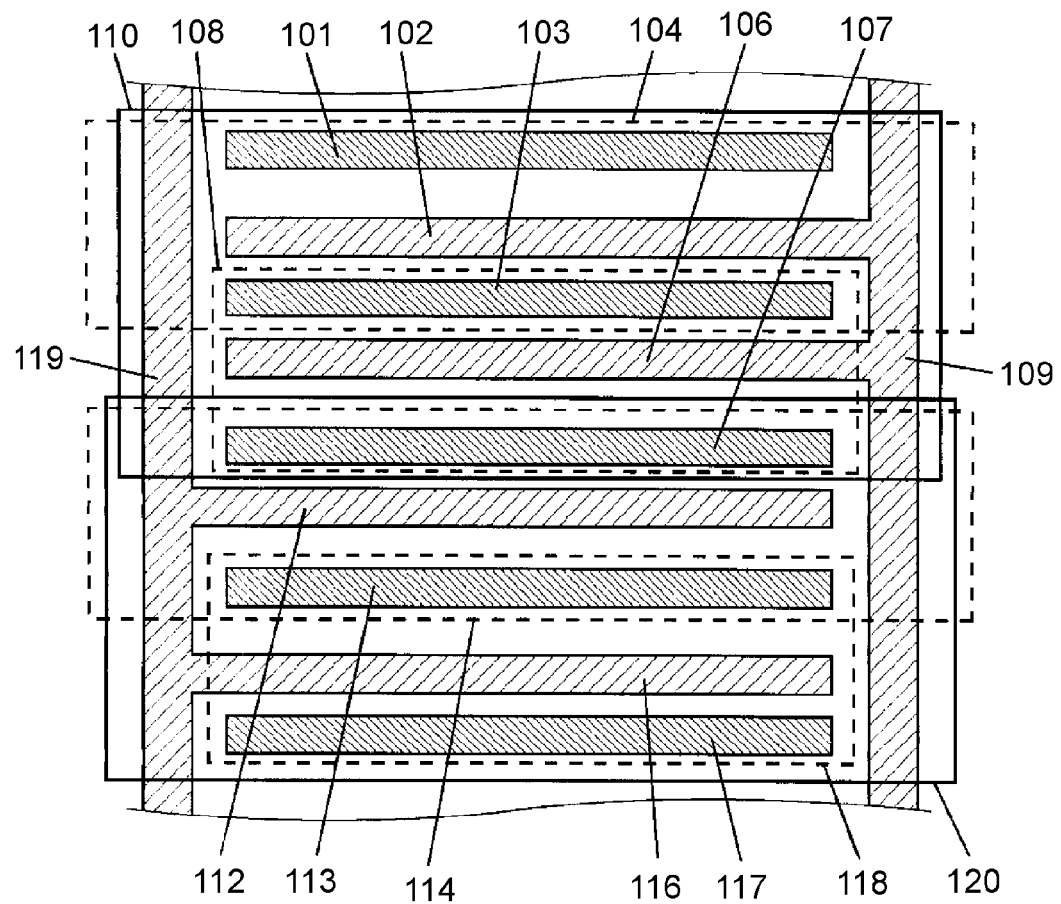
FIG. 1 is a device layout diagram of a semiconductor device according to a first exemplary embodiment.
Figure 2A:
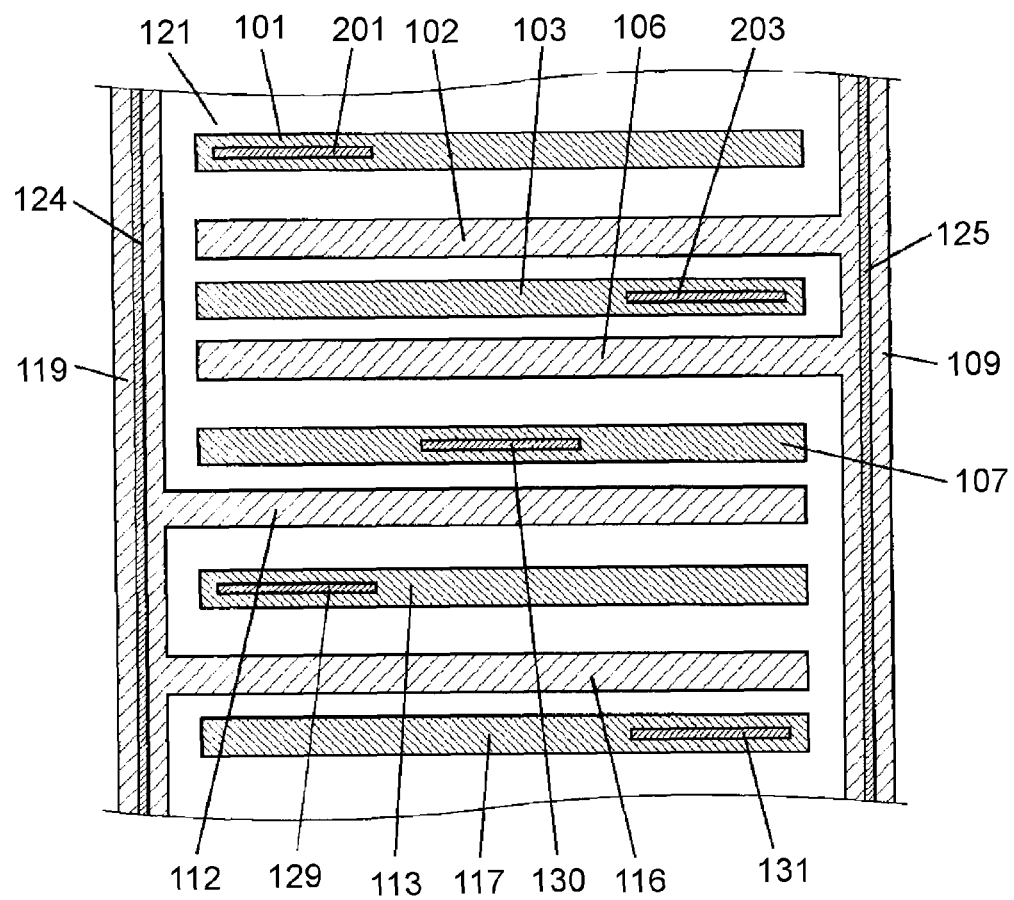
FIG. 2A is a device layout diagram of the semiconductor device according to the first exemplary embodiment.
Figure 2B:
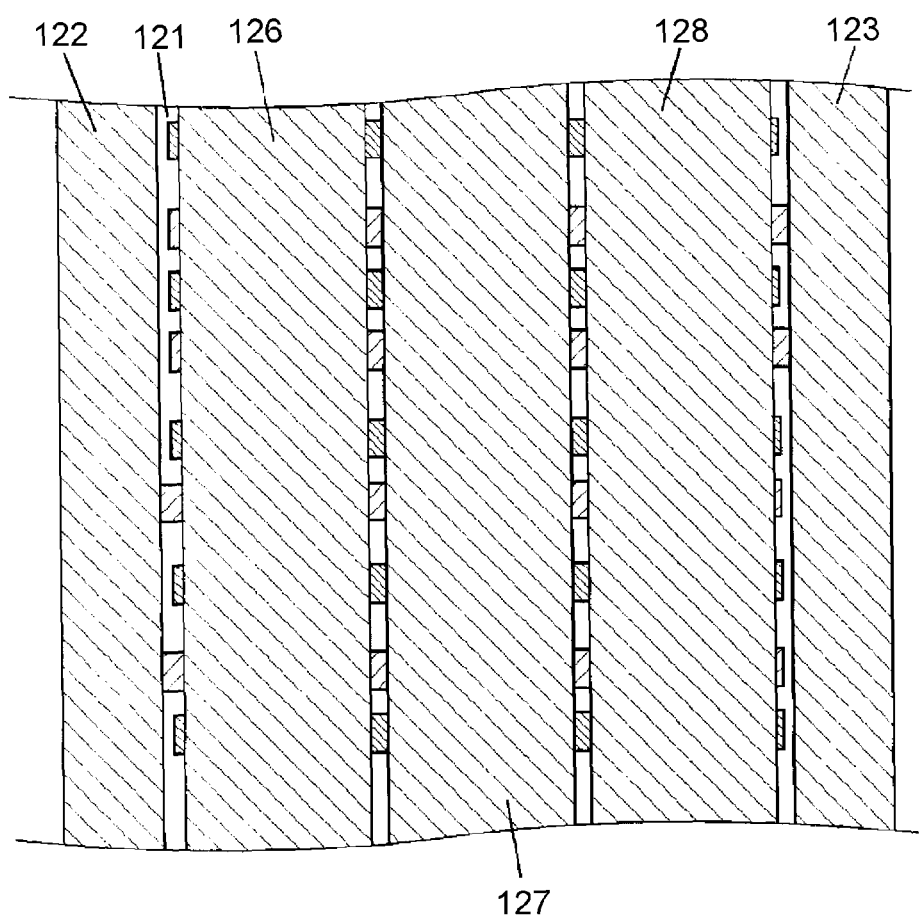
FIG. 2B is a device layout diagram of the semiconductor device according to the first exemplary embodiment.
Figure 3A:
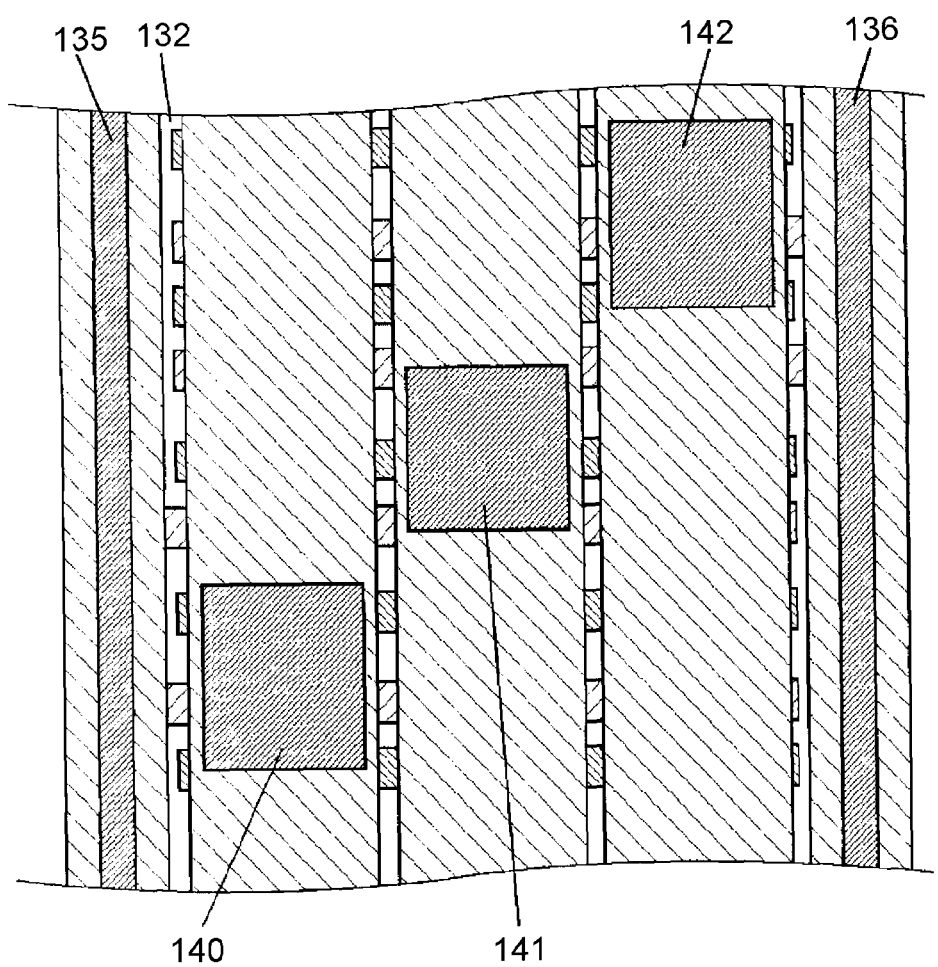
FIG. 3A is a device layout diagram of the semiconductor device according to the first exemplary embodiment.
Figure 3B:
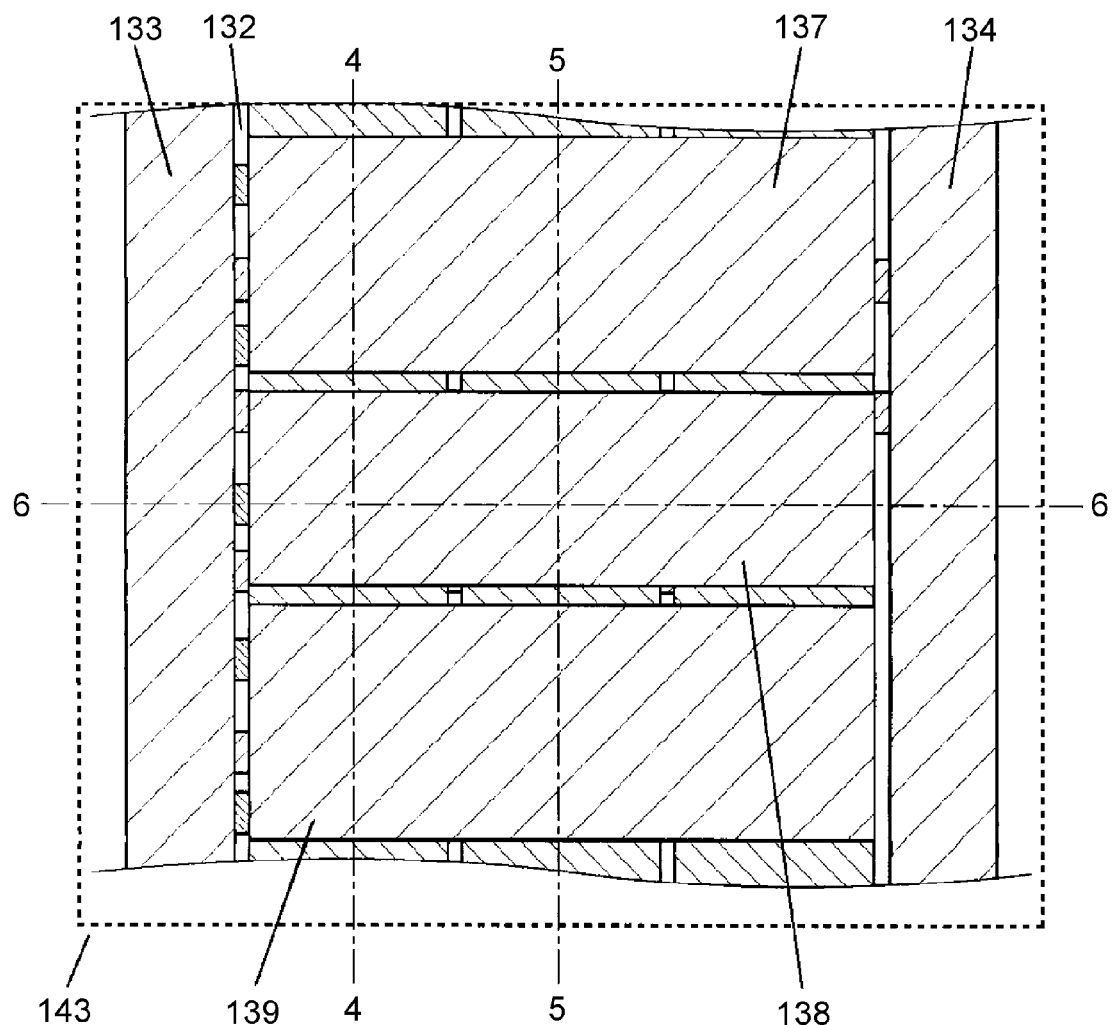
FIG. 3B is a device layout diagram of the semiconductor device according to the first exemplary embodiment.

FIGS. 1 to 3B show device layouts in the semiconductor device. This device is a field effect transistor made of a nitride semiconductor, as one example. To make the description understandable, FIG. 1 shows a layout of a surface of the semiconductor layer laminate, FIGS. 2A and 2B show layouts of a first layer of a thick film rewiring, and FIGS. 3A and 3B show layouts of a second layer of the thick film rewiring.

First, a configuration in FIG. 1 will be described. First low-side transistor 104 in a DC-DC converter includes first drain electrode 101, first gate electrode 102, and first source electrode 103. First gate electrode 102 is disposed between first drain electrode 101 and first source electrode 103.

Second low-side transistor 108 includes first source electrode 103, second gate electrode 106, and first electrode 107 functioning as a drain electrode. Second gate electrode 106 is disposed between first electrode 107 and first source electrode 103.

That is, first source electrode 103 serves as the source electrode of first low-side transistor 104 and the source electrode of second low-side transistor 108.

Each of first gate electrode 102 and second gate electrode 106 is extracted from first gate electrode lead wire 109. Hereinafter, first low-side transistor 104 and second low-side transistor 108 are collectively referred to as first low-side transistor group 110.

First high-side transistor 114 in the DC-DC converter includes first electrode 107 serving as a source electrode, third gate electrode 112, and second drain electrode 113. Third gate electrode 112 is disposed between first electrode 107 and second drain electrode 113.

That is, first electrode 107 serves as the drain electrode of second low-side transistor 108, and the source electrode of first high-side transistor 114.

Second high-side transistor 118 includes second drain electrode 113, fourth gate electrode 116, and second source electrode 117. Fourth gate electrode 116 is disposed between second drain electrode 113 and second source electrode 117.

That is, second drain electrode 113 serves as the drain electrode of first high-side transistor 114, and the drain electrode of second high-side transistor 118.

Each of third gate electrode 112 and fourth gate electrode 116 is extracted from second gate electrode lead wire 119. Hereinafter, first high-side transistor 114 and second high-side transistor 118 are collectively referred to as first high-side transistor group 120.

First gate electrode lead wire 109 and second gate electrode lead wire 119 are disposed parallel to each other across first electrode 107. Furthermore, a lead-out direction of the gate electrodes of first low-side transistor group 110 is opposite to a lead-out direction of the gate electrodes of first high-side transistor group 120.

Next, configurations shown in FIGS. 2A and 2B will be described. FIG. 2A shows positions of via holes formed in a layer between the electrodes disposed on the semiconductor layer laminate and a wiring layer. FIG. 2B shows a layout of the wiring layer.

First dielectric layer 121 is deposited on the transistor electrodes shown in FIG. 1. First dielectric layer 121 preferably has a structure in which a polybenzoxazole (PBO) layer is stacked on silicon nitride (SiN) layer. The PBO layer can be thickly formed and a relative permittivity of PBO is low, so that inter-wiring capacity can be low when a multilayer wiring is formed. Furthermore, the structure may have only the SiN layer or only the PBO layer.

In addition, in this specification, the "above" or "upper" means a direction from the semiconductor layer laminate toward the wiring layer.

Furthermore, in the case where the dielectric layer is comprised of the SiN layer and the PBO layer, a metal wiring layer may be formed as needed on the SiN layer deposited on the gate, source, and drain electrodes (including first electrode 107, which is the same in the following description), to be used as a pull-up wiring of the gate, the source, and the drain electrodes in the transistor. When the metal wiring layer is used, wiring resistance of the source and drain electrodes can be low. Furthermore, the metal wiring layer can be thinly formed on the SiN layer, so that a fine wiring pattern can be formed. As another structure in the case where the metal wiring layer is used, a SiN layer may be stacked on the metal wiring layer again, and the PBO layer may be formed on it. Alternatively, the PBO layer may be directly formed on the metal wiring layer. Instead of the PBO layer, a layer may be made of another dielectric material such as benzocyclobutene (BCB).

The pull-up wiring is formed on first dielectric layer 121 from the respective electrodes shown in FIG. 1.

First drain pull-up electrode 126 is disposed above first drain electrode 101 and second drain electrode 113. First drain electrode 101 and second drain electrode 113 are connected to first drain pull-up electrode 126 through via hole 201 and via hole 129, respectively.

First drain and source common pull-up electrode 127 is disposed above first electrode 107, and connected to first electrode 107 through via hole 130. (That is, first drain and source common pull-up electrode is first common pull-up electrode to the drain electrode of second low-side transistor 108 and the source electrode of first high-side transistor 114.)

First source pull-up electrode 128 is disposed above first source electrode 103 and second source electrode 117. First source electrode 103 and second source electrode 117 are connected to first source pull-up electrode 128 through via hole 203 and via hole 131, respectively.

First gate pull-up electrode 122 is disposed above second gate electrode lead wire 119, and connected to second gate electrode lead wire 119 through via hole 124.

Second gate pull-up electrode 123 is disposed above first gate electrode lead wire 109 and connected to first gate electrode lead wire 109 through via hole 125.

Each via hole is preferably disposed so as to wholly overlap with the pull-up electrode in a plan view to prevent a connection defect between the electrode of the transistor and the pull-up electrode.

FIGS. 3A and 3B will be described. FIG. 3A shows positions of via holes in a layer between the first wiring layer and a second wiring layer. FIG. 3B shows a layout of the second wiring layer.

Second dielectric layer 132 is disposed on the pull-up electrodes shown in FIG. 2B. Second dielectric layer 132 is preferably made of a low dielectric material such as PBO or BCB, thereby reducing inter-wiring capacity formed in the different wiring layers. In addition, another material may be used.

Electrode pads are pulled up from the pull-up electrodes shown in FIG. 2B and disposed on second dielectric layer 132. First gate electrode pad 133 is disposed above first gate pull-up electrode 122, and connected to first gate pull-up electrode 122 through via hole 135. Second gate electrode pad 134 is disposed above second gate pull-up electrode 123, and connected to second gate pull-up electrode 123 through via hole 136.

First drain electrode pad 139 is disposed above first drain pull-up electrode 126, and connected to first drain pull-up electrode 126 through via hole 140.

First drain and source common electrode pad 138 is disposed above first drain and source common pull-up electrode 127, and connected to first drain and source common pull-up electrode 127 through via hole 141.

First source electrode pad 137 is disposed above first source pull-up electrode 128, and connected to first source pull-up electrode 128 through via hole 142.

The layout structure shown in FIGS. 1 to 3B is a minimum unit cell in the half-bridge configuration of the DC-DC converter composed of the high-side transistor and the low-side transistor. This cell is referred to as half-bridge cell 143.

Figure 4:
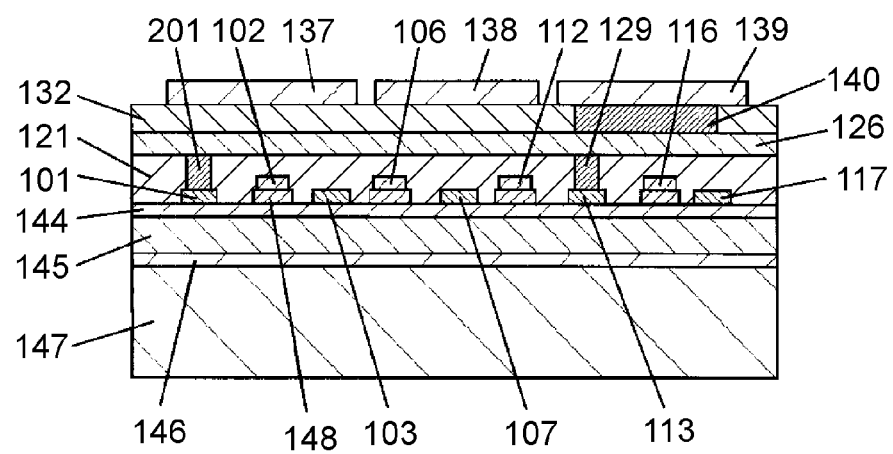
FIG. 4 is a cross-sectional view of the semiconductor device according to the first exemplary embodiment.
Figure 5:
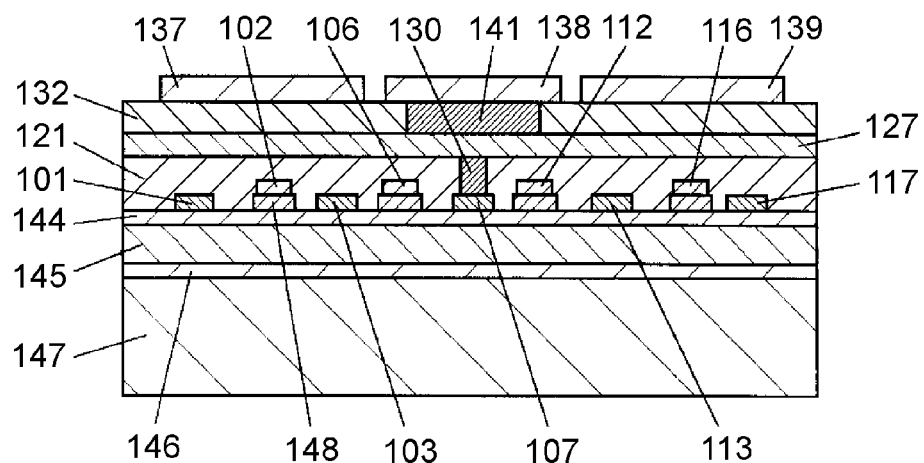
FIG. 5 is a cross-sectional view of the semiconductor device according to the first exemplary embodiment.
Figure 6:
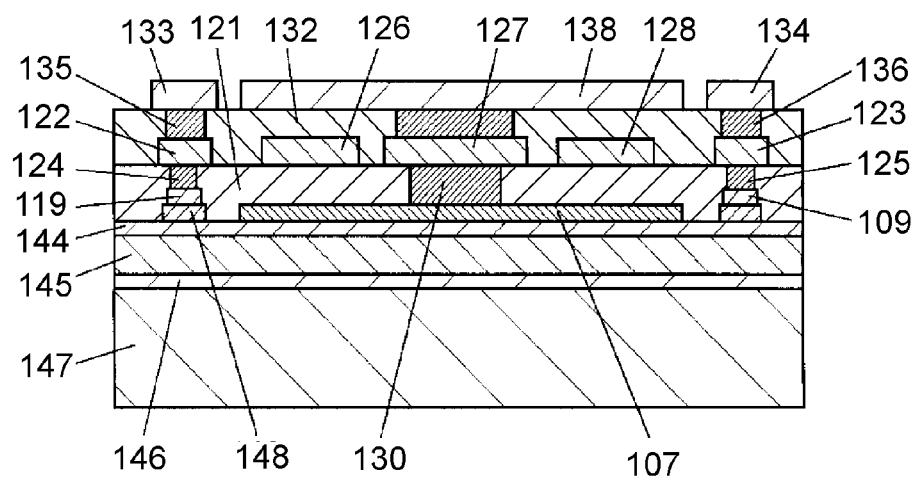
FIG. 6 is a cross-sectional view of the semiconductor device according to the first exemplary embodiment.

FIGS. 4 to 6 each show a cross-sectional structure of the device according to this exemplary embodiment. FIGS. 4, 5, and 6 are cross-sectional views taken along lines 4-4, 5-5, and 6-6 in FIG. 3B, respectively.

FIGS. 4, 5, and 6 show one example of a material configuration of a semiconductor substrate and the semiconductor layer laminate.

First layer 145 comprised of undoped gallium nitride (GaN) having a thickness of 1 μm to 2 μm is disposed on conductive substrate 147 composed of silicon (Si), with buffer layer 146 comprised of aluminum nitride (AlN), and having a thickness of 100 nm, interposed between substrate 147 and first layer 145. Second layer 144 comprised of undoped aluminum gallium nitride (AlGaN) having a thickness of 10 nm to 20 nm is disposed on first layer 145. Here, "undoped" means that an impurity to determine a conductivity type is not doped intentionally.

Electric charges are generated due to spontaneous polarization or piezo polarization in a vicinity of a hetero interface between first layer 145 and second layer 144. Thus, a channel region is generated as a two-dimensional electron gas (2DEG) layer having a sheet carrier concentration of $1 \times 10^{13}$ cm$^{-2}$ or more and a mobility of 1000 cm$^2$V/sec or more.

Each of first drain electrode 101, first source electrode 103, first electrode 107, second drain electrode 113, and second source electrode 117 disposed on semiconductor layer laminate has a structure in which a titanium (Ti) layer and an aluminum (Al) layer are stacked, and makes an ohmic contact with the channel region.

Each of first gate electrode 102, second gate electrode 106, third gate electrode 112, and fourth gate electrode 116 is disposed on second layer 144 with p-type nitride semiconductor layer 148 interposed between them. Each gate electrode may have a structure in which a palladium (Pd) layer and a gold (Au) layer are stacked, and makes an ohmic contact with p-type nitride semiconductor layer 148.

Furthermore, p-type nitride semiconductor layer 148 has a thickness of 100 nm to 300 nm, and is comprised of magnesium (Mg)-doped AlGaN. A PN junction is formed in a vicinity of an interface between p-type nitride semiconductor layer 148 and second layer 144. Thus, when 0 V is applied to the gate electrode, a depletion layer is formed from p-type nitride semiconductor layer 148 toward substrate 147, and the source electrode or the drain electrode, in second layer 144 and first layer 145. Therefore, when 0 V is applied to the gate electrode, a current does not flow in the channel region, so that a normally-off operation can be provided.

Furthermore, when a gate voltage of 3 V or more which exceeds a built-in potential of the PN junction is applied to the gate electrode, holes can be injected to the channel region. A mobility of the hole is considerably lower than a mobility of an electron in the nitride semiconductor, so that the holes injected in the channel region hardly serves as a carrier of a current. Therefore, the injected holes function as donner ions which generate the same amount of electrons in the channel region to improve an effect of generating the electrons in the channel region. That is, a carrier concentration can be modified in the channel region, so that it is possible to realize a normally-off power semiconductor element in which an operating current is large, and resistance is low.

With the above configuration, a distance between the source electrode of the high-side transistor and the drain electrode of the low-side transistor becomes zero ideally, so that a parasitic inductance in its connection part can be eliminated. As a result, there is an improvement in power conversion efficiency of the DC-DC converter. Furthermore, since the electrodes are shared by the transistors, a chip size can be reduced.

Figure 7:
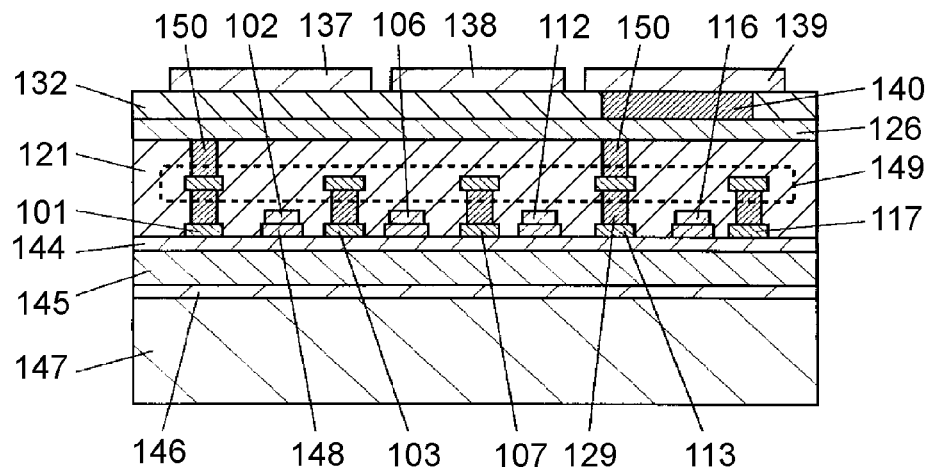
FIG. 7 is a cross-sectional view in which a metal wiring layer is added to the semiconductor device according to the first exemplary embodiment.
Figure 8:
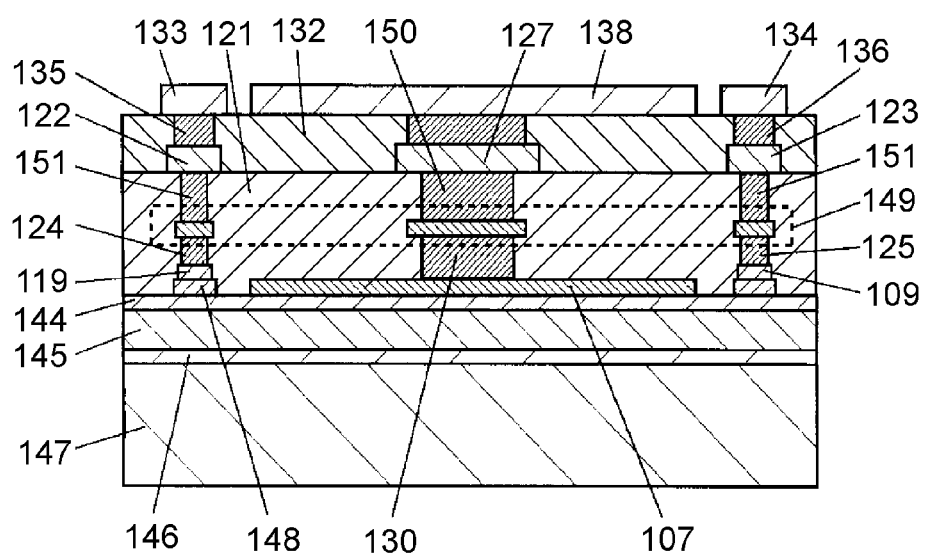
FIG. 8 is a cross-sectional view in which the metal wiring layer is added to the semiconductor device according to the first exemplary embodiment.

As shown in FIGS. 7 and 8, metal wiring layer 149 may be disposed between each of the gate electrode, the source electrode and the drain electrode, and the pull-up electrode of each terminal.

Thus, it is desirable that first via hole group 150 is disposed above metal wiring layer 149 connected to the source electrode and the drain electrode, and second via hole group 151 is disposed above metal wiring layer 149 connected to the gate electrode. When the metal wiring layer is added on each electrode of the semiconductor layer laminate, resistance of each electrode is lowered, which contributes to an improvement in Ron of the transistor.

Figure 9:
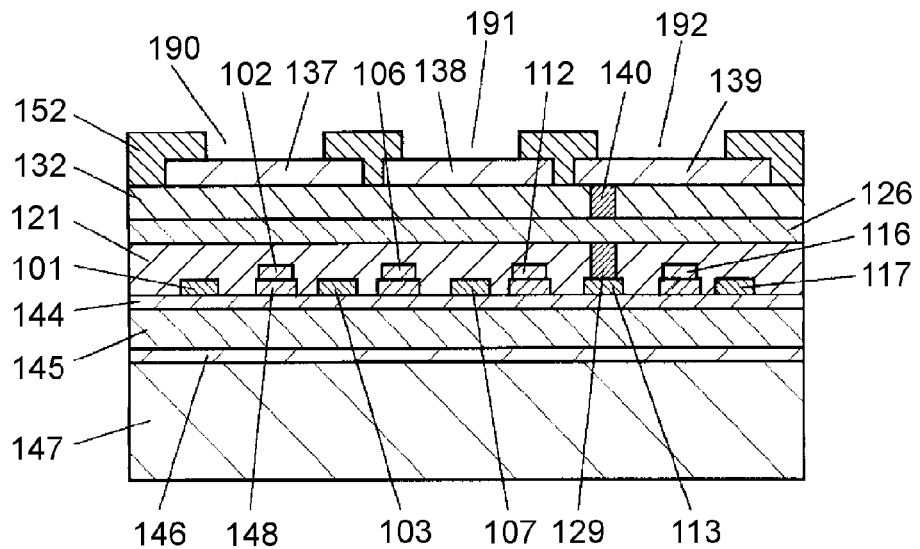
FIG. 9 is a cross-sectional view in which a dielectric layer and an opening are added to the semiconductor device according to the first exemplary embodiment.

As shown in FIG. 9, third dielectric layer 152 may be further disposed on each electrode pad disposed on second dielectric layer 132 serving as a passivation film. This layer can serve as a protective film at the time of mounting to a printed substrate (flip chip bonding, in particular). Third dielectric layer 152 may be made of a dielectric material such as PBO or BCB which can be thickly formed, or may be made of other dielectric materials.

As shown in FIG. 9, first opening 190, second opening 191, and third opening 192 are formed in third dielectric layer 152 on each electrode pad. Each opening is preferably smaller than each electrode pad in size. More specifically, it is favorable that first opening 190 wholly overlaps with first source electrode pad 137 in a plan view, second opening 191 wholly overlaps with first drain and source common electrode pad 138 in a plan view, and third opening 192 wholly overlaps with first drain electrode pad 139 in a plan view.

With this configuration, at the time of mounting on the printed substrate, especially at the time of the flip chip bonding, a solder comes in contact with the dielectric layer, which can prevent a leak which could be generated from a contact point.

Second Exemplary Embodiment

Hereinafter, a semiconductor device according to the second exemplary embodiment will be described with reference to the accompanying drawings.

Figure 10:
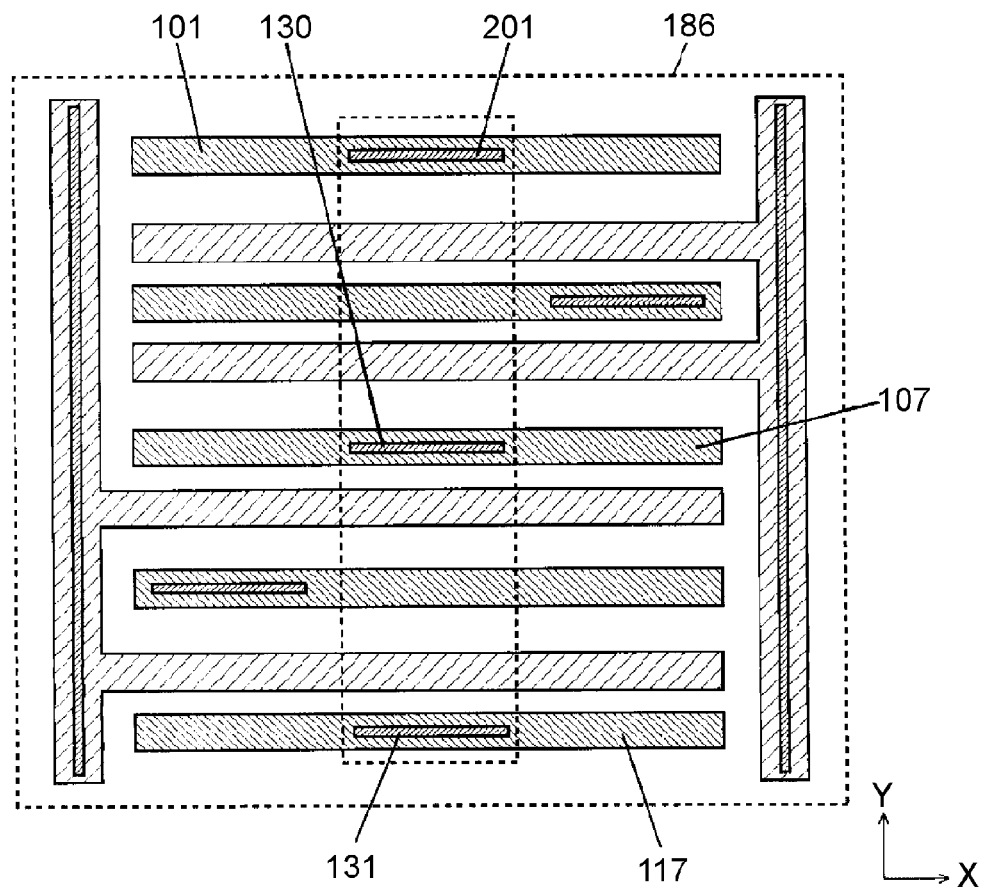
FIG. 10 is a device layout diagram of a semiconductor device according to a second exemplary embodiment.
Figure 11:
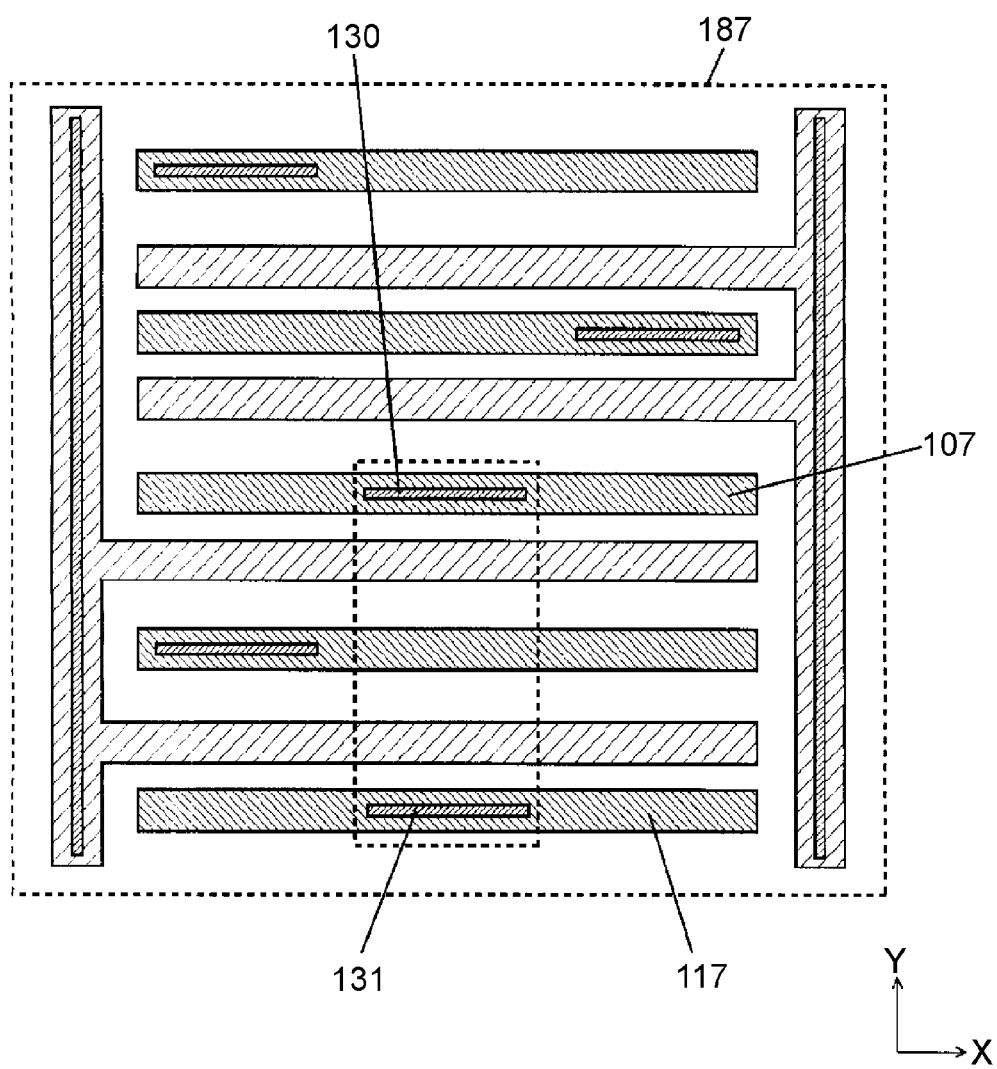
FIG. 11 is a device layout diagram of the semiconductor device according to the second exemplary embodiment.
Figure 12:
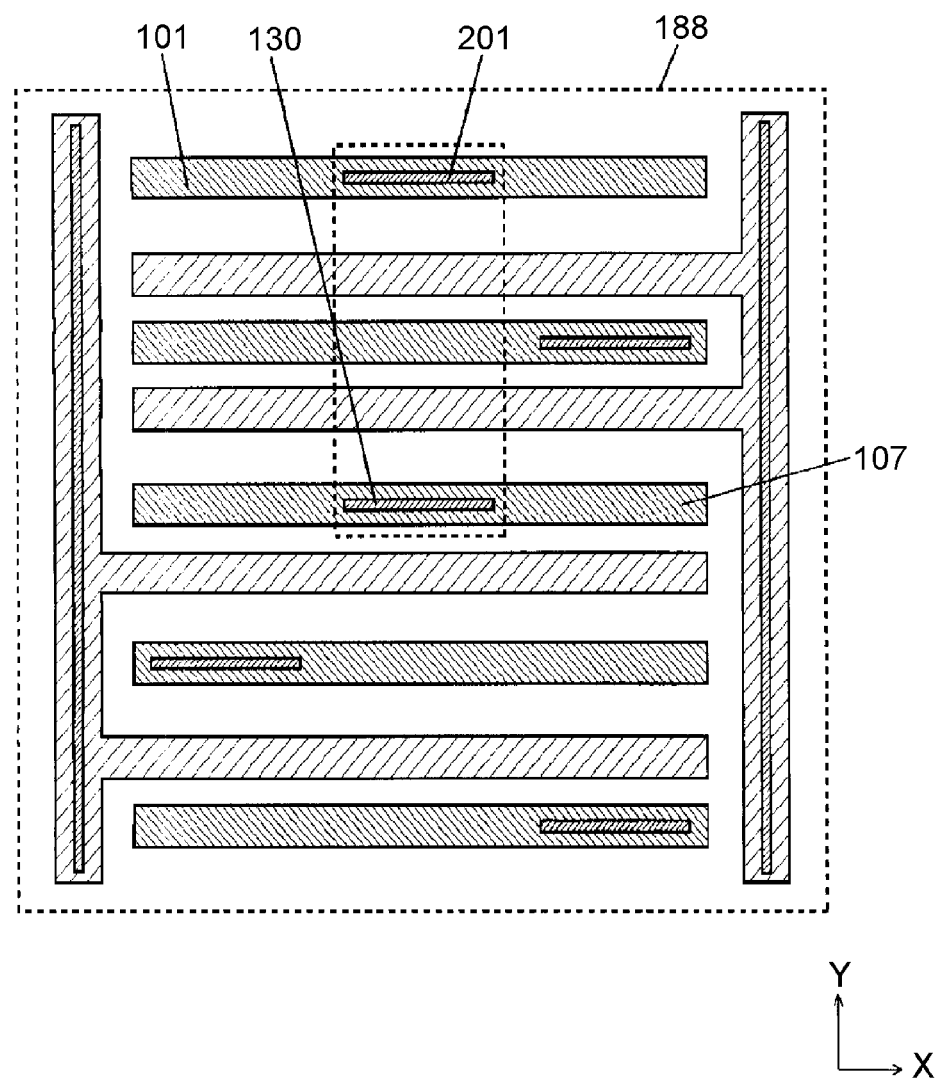
FIG. 12 is a device layout diagram of the semiconductor device according to the second exemplary embodiment.

The layout structure shown in FIGS. 1 to 3B is the minimum unit cell of the DC-DC converter having the half-bridge configuration as described above. The DC-DC converter including a chip transistor having a large gate width cannot be implemented only with half-bridge cell 143, so that it is necessary to deform half-bridge cell 143 and arrange a plurality of deformed cells. FIGS. 10, 11 and 12 show cells provided by deforming half-bridge cell 143.

As shown in FIG. 10, via hole 201 disposed on first drain electrode 101, via hole 131 disposed on second source electrode 117, and via hole 130 disposed on first electrode 107 in half-bridge cell 143 are all disposed so as to wholly overlap with upper first drain and source common pull-up electrode 127 in a plan view. The half-bridge cell shown in FIG. 10 is referred to as connection half-bridge cell 186 which is supposed to be connected to other half-bridge cells on sides of first drain electrode 101 and second source electrode 117.

Furthermore, in this specification, the term "in a plan view" means that it is viewed from a direction perpendicular to the semiconductor substrate surface.

As shown in FIG. 11, via hole 131 disposed on second source electrode 117, and via hole 130 disposed on first electrode 107 in half-bridge cell 143 are all disposed so as to wholly overlap with upper first drain and source common pull-up electrode 127 in a plan view. The half-bridge cell shown in FIG. 11 is referred to as first edge half-bridge cell 187 which is supposed to be connected to another half-bridge cell on only the side of second source electrode 117.

As shown in FIG. 12, via hole 201 disposed on first drain electrode 101, and via hole 130 disposed on first electrode 107 in half-bridge cell 143 are all disposed so as to wholly overlap with upper first drain and source common pull-up electrode 127 in a plan view. The half-bridge cell shown in FIG. 12 is referred to as second edge half-bridge cell 188 which is supposed to be connected to another half-bridge cell on only the side of first drain electrode 101.

Figure 13:
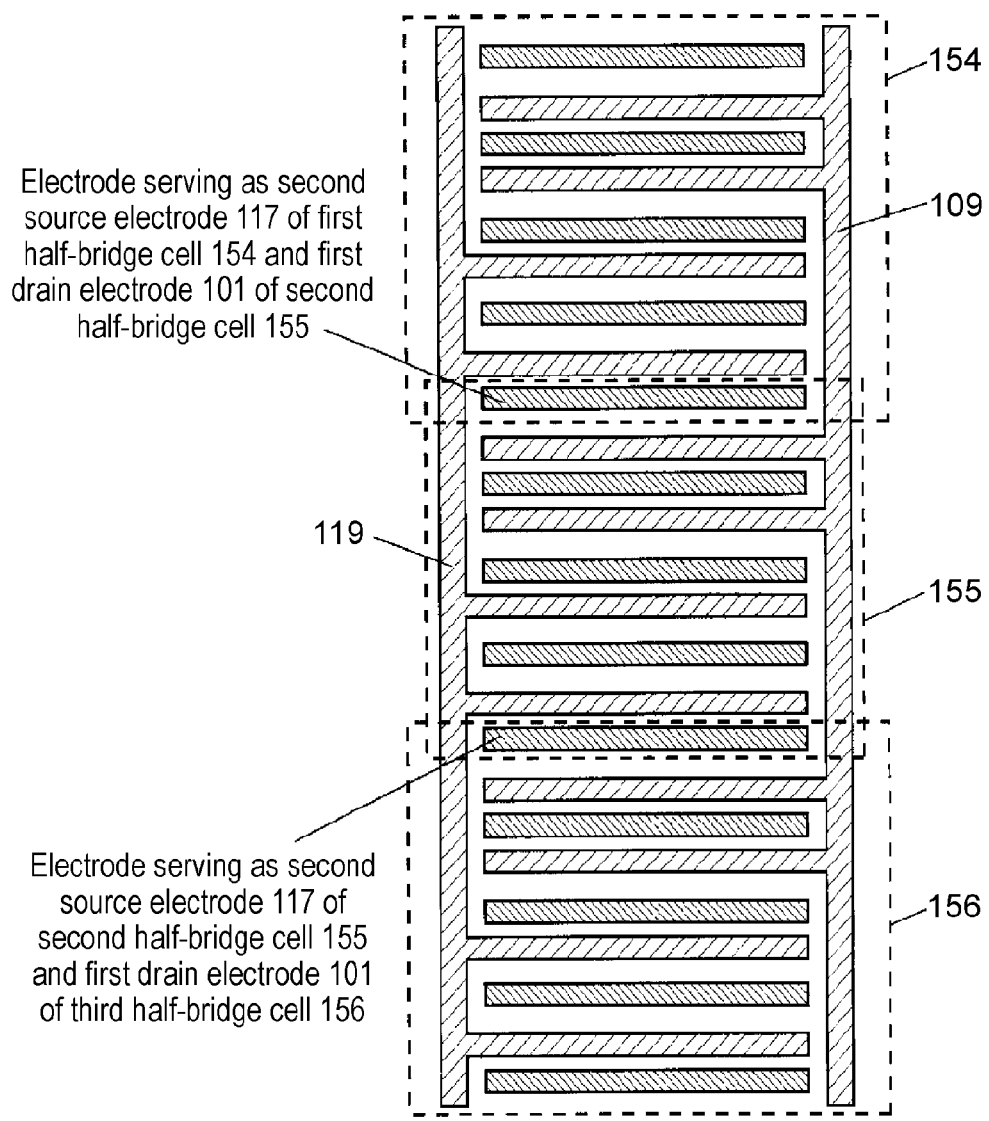
FIG. 13 is a device layout diagram of the semiconductor device according to the second exemplary embodiment.

FIGS. 13 to 15B show device layout diagrams in the semiconductor device according to this exemplary embodiment. The device shown in FIGS. 13 to 15B is a field effect transistor composed of a nitride semiconductor, as one example. To make the description understandable, FIG. 13 shows a layout of a surface of a semiconductor device, FIGS. 14A and 14B each show a layout of a first layer of a thick film rewiring, and FIGS. 15A and 15B each show a layout of a second layer of the thick film rewiring.

First, a configuration in FIG. 13 will be described. A plurality (N) of half-bridge cells shown in FIGS. 1 to 3B are disposed. FIGS. 13 to 15B show a case where N=3.

Second source electrode 117 of first half-bridge cell 154 (having the same configuration as first edge half-bridge cell 187) is combined with first drain electrode 101 of second half-bridge cell 155 (having the same configuration as connection half-bridge cell 186). Second source electrode 117 of second half-bridge cell 155 is combined with first drain electrode 101 of third half-bridge cell 156 (having the same configuration as second edge half-bridge cell 188).

As shown in FIG. 13, first gate electrode lead wires 109 and second gate electrode lead wires 119 are favorably connected to each other over the cells. The gate electrode lead wires are all preferably connected, because a gate resistance value which could deteriorate operation characteristics of the DC-DC converter can be reduced. Meanwhile, the electrodes are disposed so as not to be connected to each other.

Figure 14A:
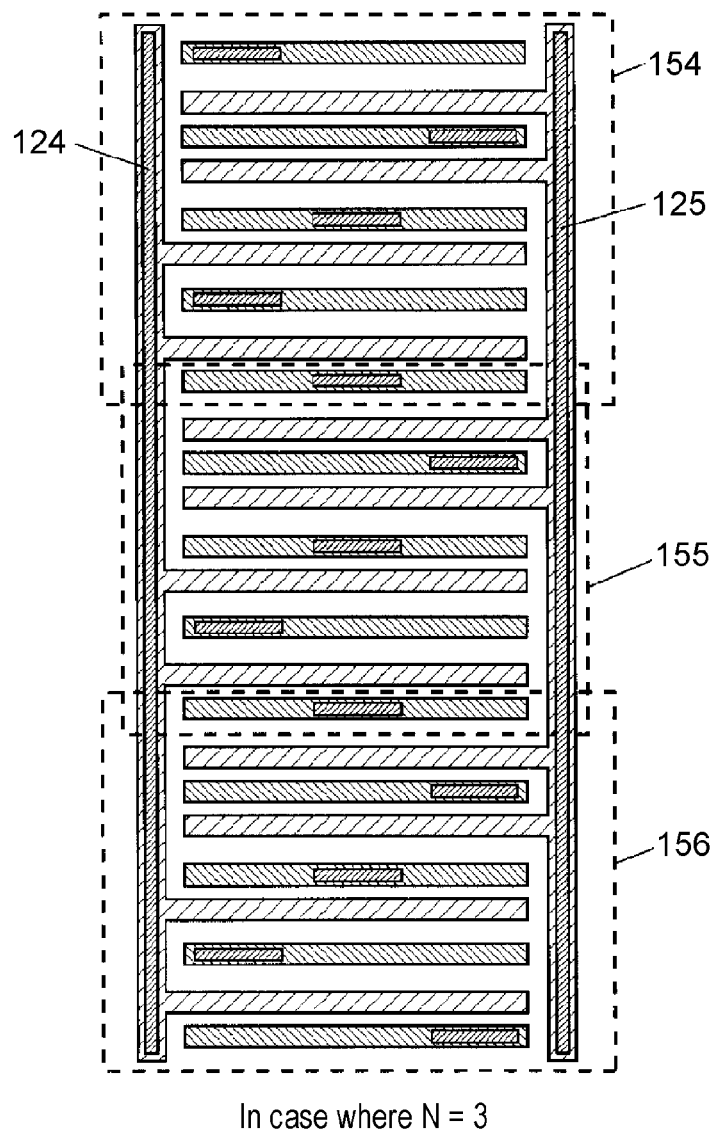
FIG. 14A is a device layout diagram of the semiconductor device according to the second exemplary embodiment.

As shown in FIG. 14A, it is preferable that via hole 124 and via hole 125 in each half-bridge cell are all connected to each other, over the cell. This is because the gate resistance value can be reduced for the same reason as the above.

Figure 14B:
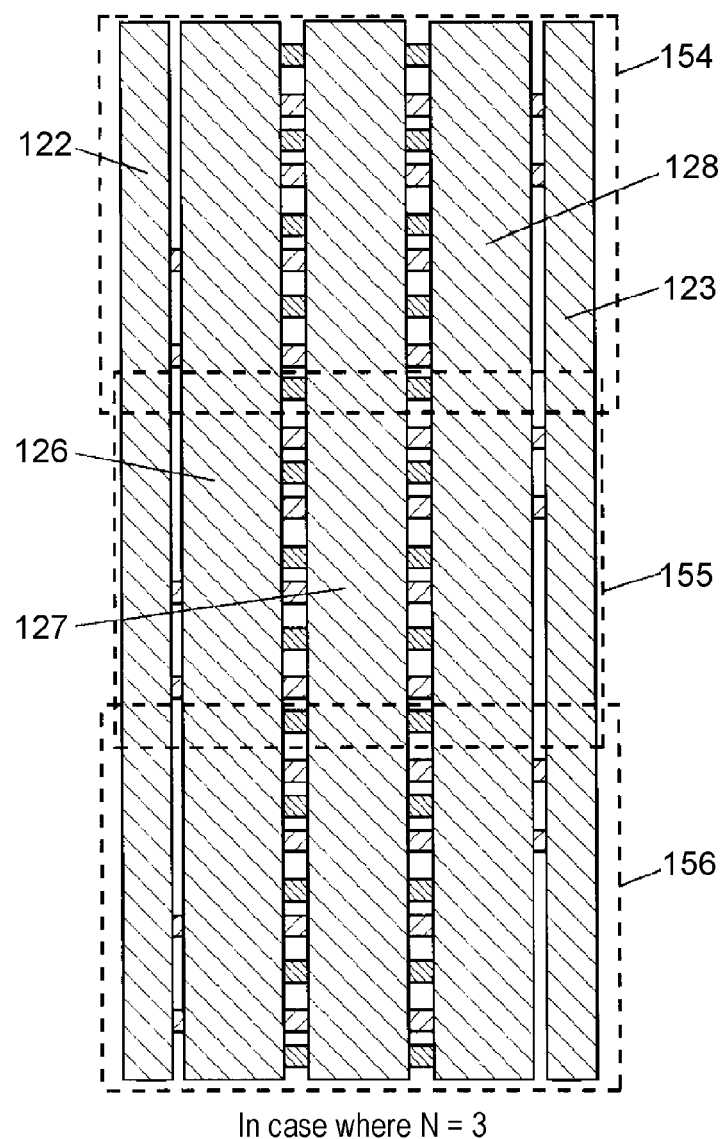
FIG. 14B is a device layout diagram of the semiconductor device according to the second exemplary embodiment.

As shown in FIG. 14B, first gate pull-up electrode 122, first drain pull-up electrode 126, first drain and source common pull-up electrode 127, first source pull-up electrode 128, and second gate pull-up electrode 123 in each half-bridge cell may be all connected to each other, over the cell.

Figure 15A:
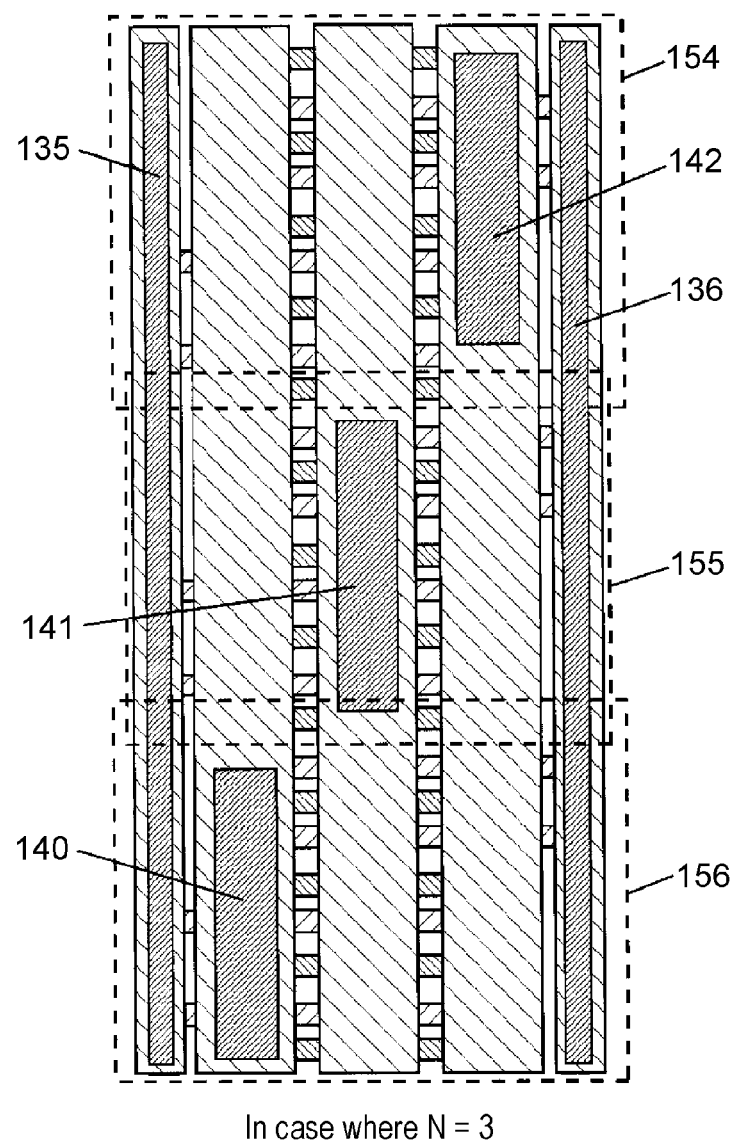
FIG. 15A is a device layout diagram of the semiconductor device according to the second exemplary embodiment.

As shown in FIG. 15A, via hole 135 and via hole 136 in each half-bridge cell may be all connected to each other, over the cell.

Figure 15B:
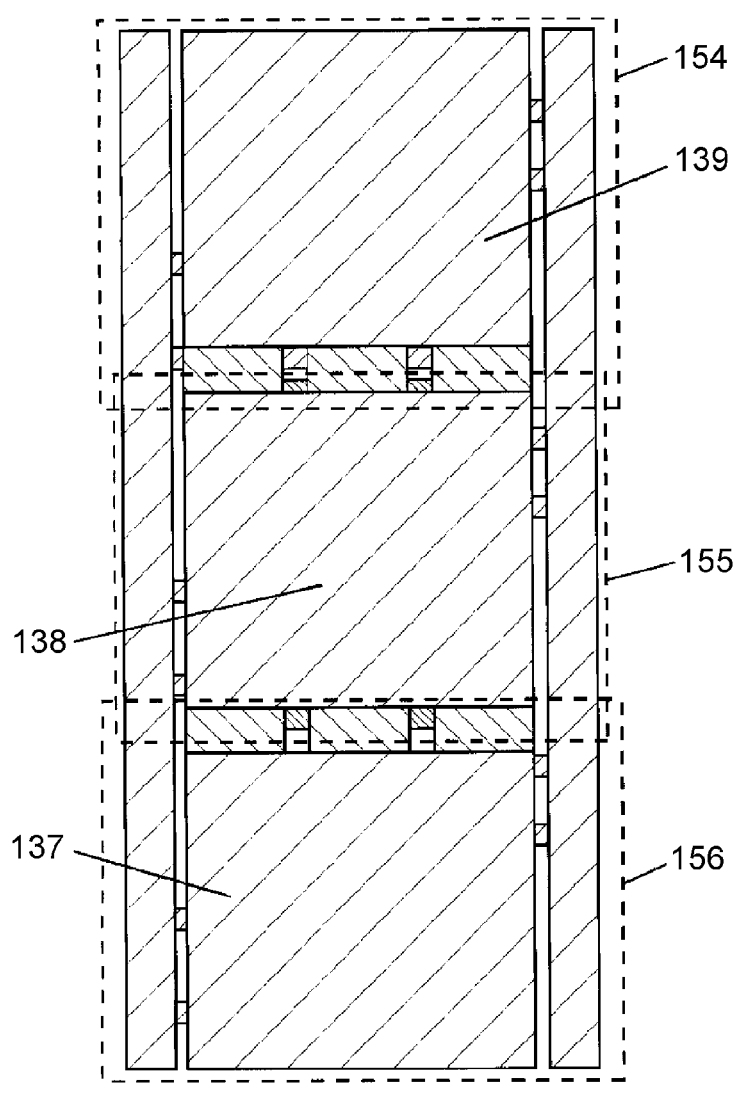
FIG. 15B is a device layout diagram of the semiconductor device according to the second exemplary embodiment.

As shown in FIG. 15B, first source electrode pad 137, first drain and source common electrode pad 138, and first drain electrode pad 139 are disposed so as not to be in contact with each other. Furthermore, via hole 140, via hole 141, and via hole 142 are disposed on first source electrode pad 137, first drain and source common electrode pad 138, and first drain electrode pad 139, respectively.

Figure 16:
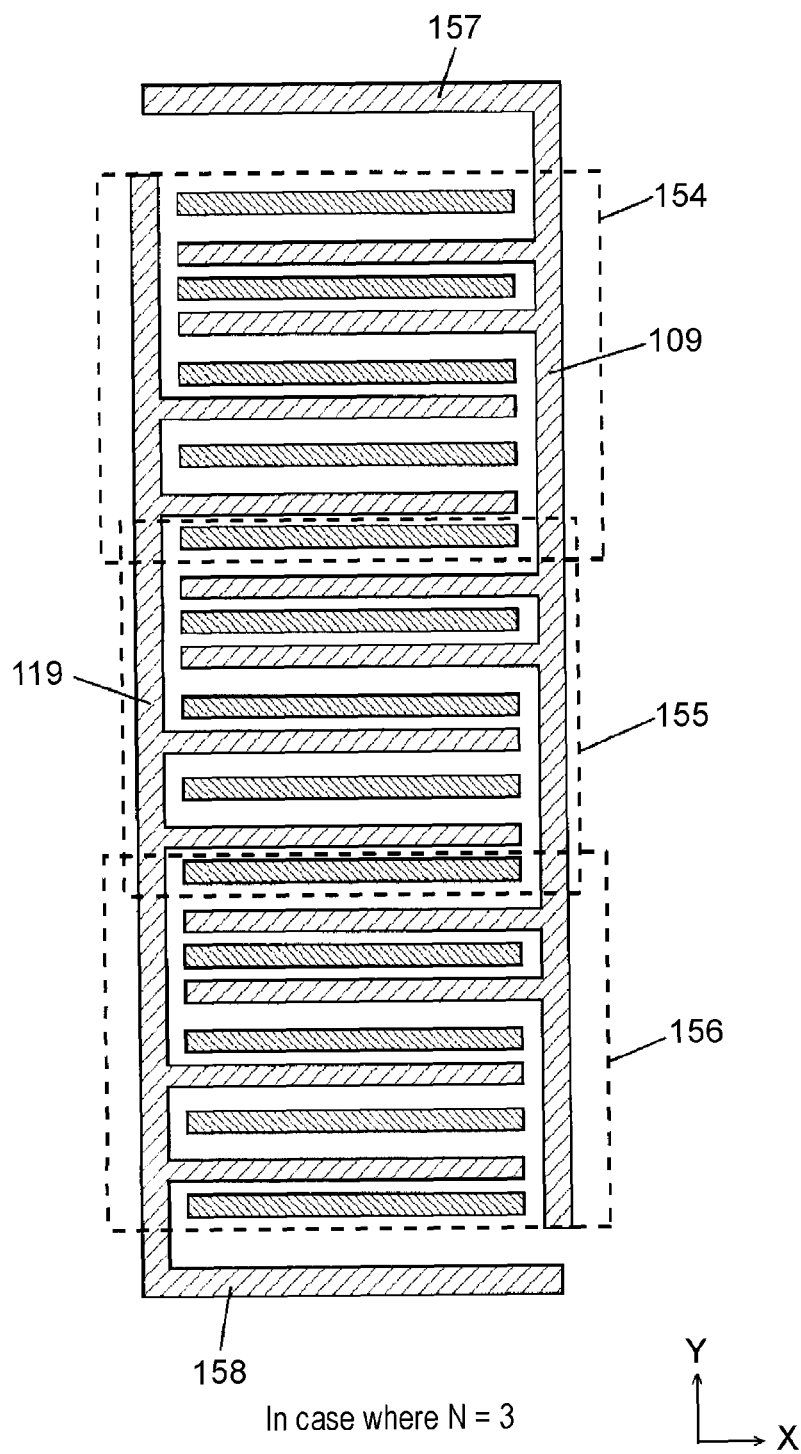
FIG. 16 is a device layout diagram showing a variation of the semiconductor device according to the second exemplary embodiment.
Figure 17:
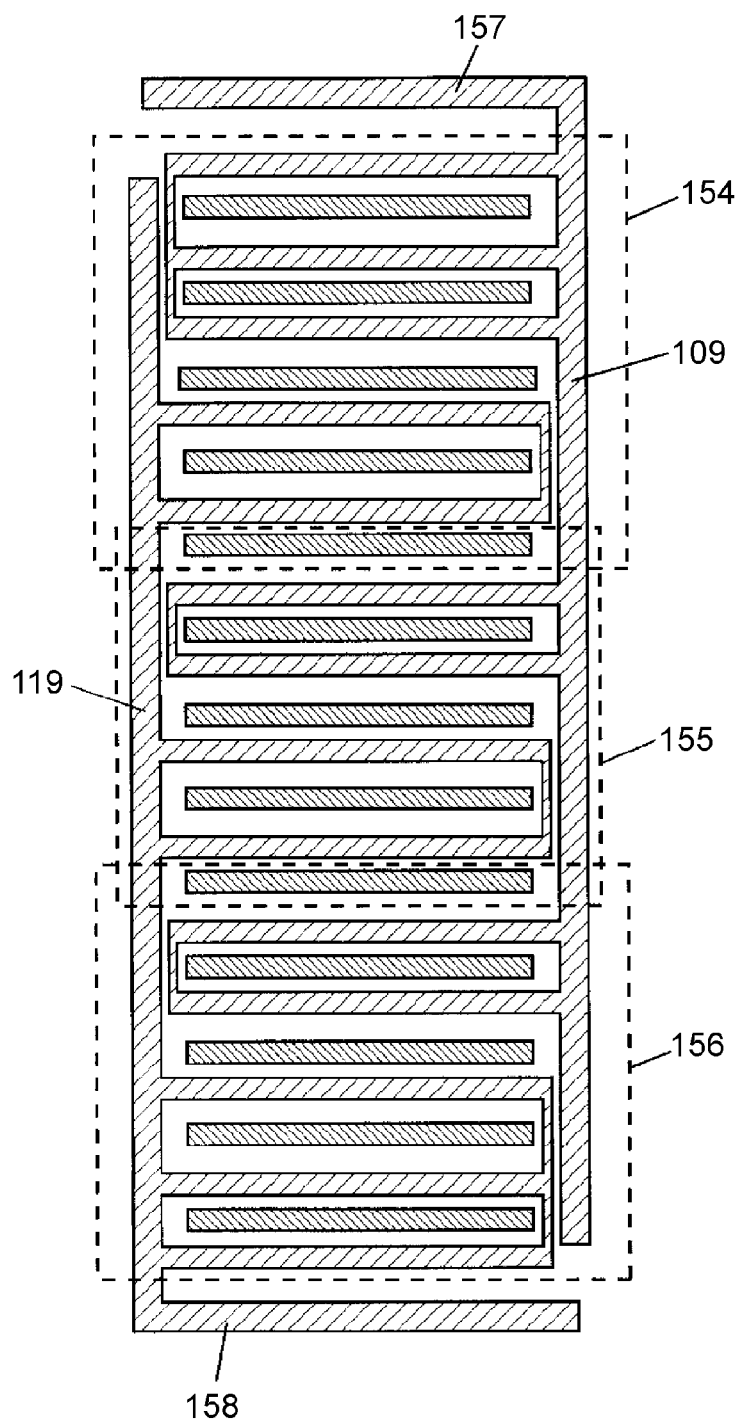
FIG. 17 is a device layout diagram showing a variation of the semiconductor device according to the second exemplary embodiment.

FIGS. 16 to 19B show device layout diagrams in variation examples of the semiconductor device according to the second exemplary embodiment. To make the description understandable, FIG. 16 shows a layout of a surface of the semiconductor device, FIG. 17 shows a layout of a first layer of a thick film rewiring, and FIGS. 18A and 18B show layouts of a second layer of the thick film rewiring.

First, a configuration in FIG. 16 will be described. The description will be given to a case where the number N of half-bridge cells is three similar to FIGS. 13 to 15B.

First gate electrode lead wire connector 157 is extracted from first gate electrode lead wire 109 in first half-bridge cell 154 so as to extend in a direction (X direction) parallel to the drain electrode and the source electrode. Second gate electrode lead wire connector 158 is extracted from second gate electrode lead wire 119 in third half-bridge cell 156 so as to extend in the direction (X direction) parallel to the drain electrode and the source electrode.

FIG. 17 shows a variation of the configuration in FIG. 16. It is preferable that each of the source electrode and the drain electrode is tightly surrounded by the gate electrode and the gate electrode lead wire in a plan view.

For example, first source electrode 103 is tightly surrounded by first gate electrode 102, second gate electrode 106, and first gate electrode lead wire 109 in a plan view. Second drain electrode 113 is tightly surrounded by third gate electrode 112, fourth gate electrode 116, and second gate electrode lead wire 119 in a plan view.

With this configuration, a leak current can be prevented from being generated and passing through the space between the gate electrodes.

Figure 18A:
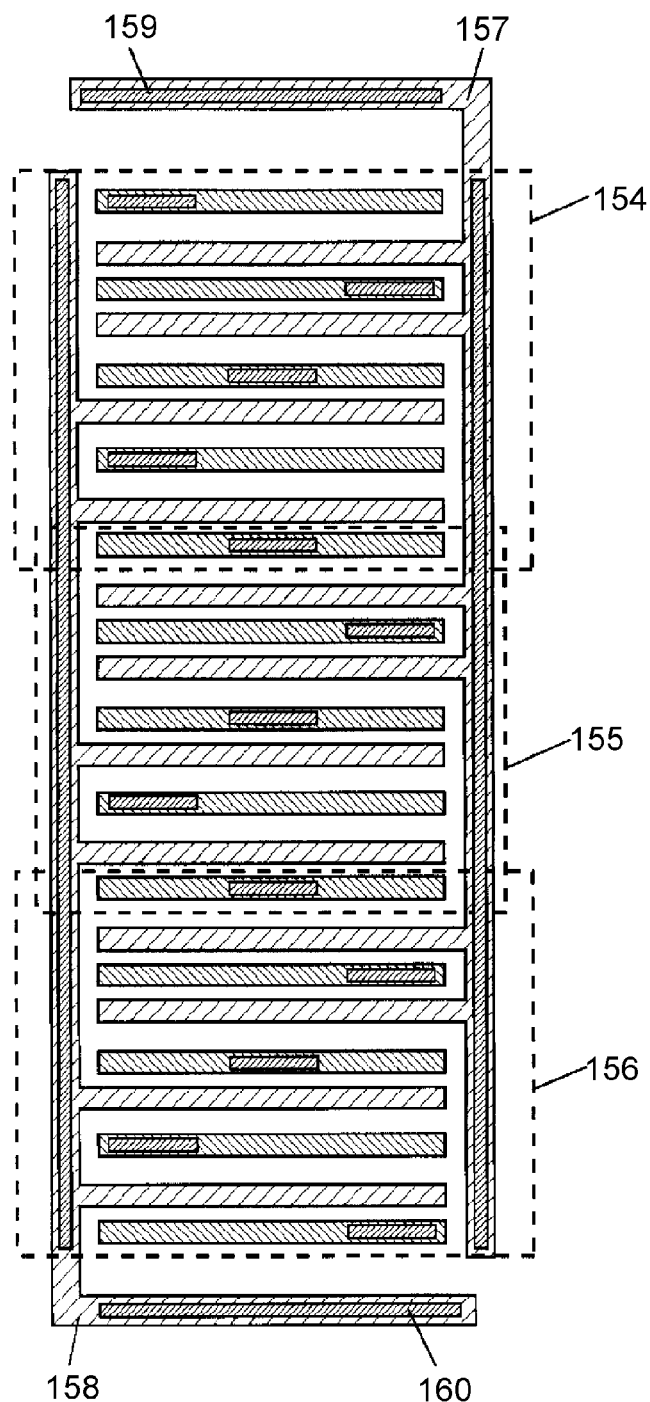
FIG. 18A is a device layout diagram showing the variation of the semiconductor device according to the second exemplary embodiment.

As shown in FIG. 18A, via hole 159 is disposed on first gate electrode lead wire connector 157. Via hole 160 is disposed on second gate electrode lead wire connector 158.

Figure 18B:
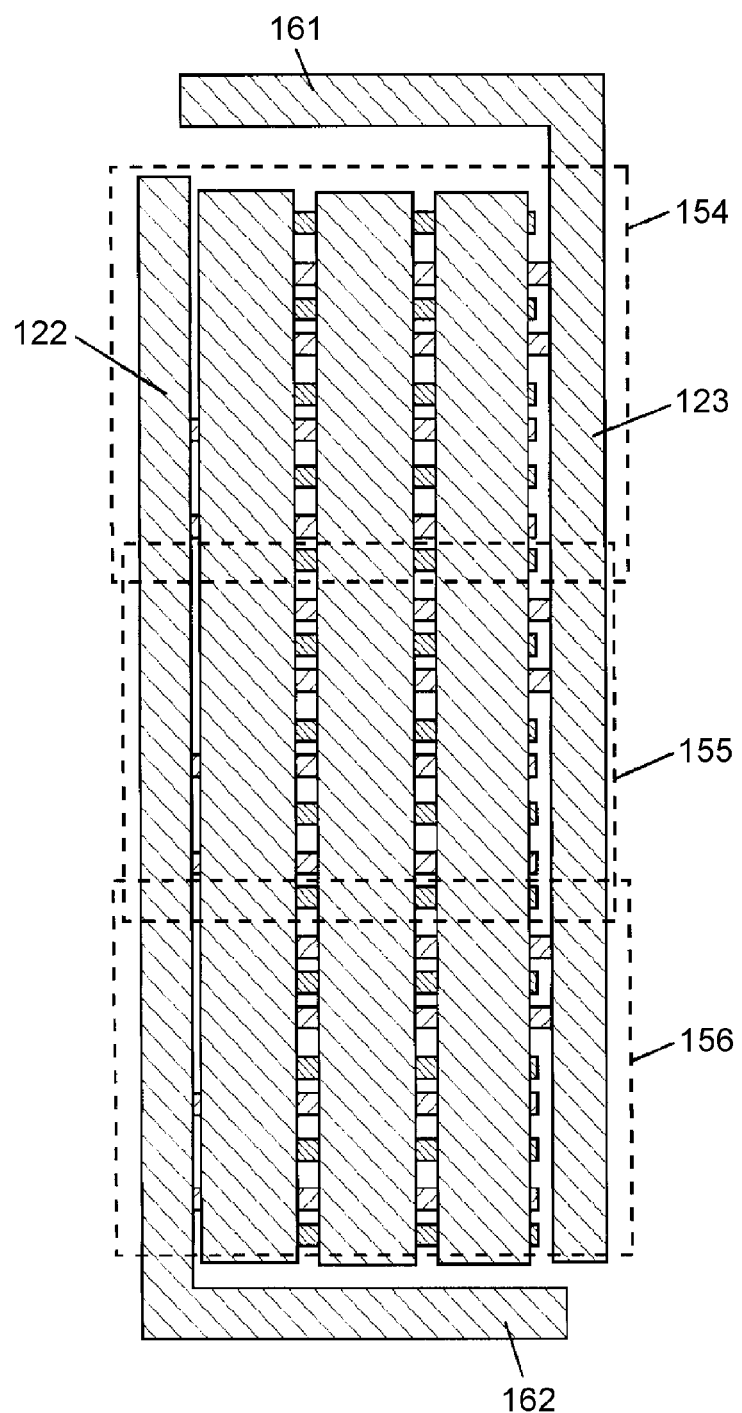
FIG. 18B is a device layout diagram showing the variation of the semiconductor device according to the second exemplary embodiment.

As shown in FIG. 18B, first gate pull-up electrode connector 161 is disposed above first gate electrode lead wire connector 157 through via hole 159. First gate pull-up electrode connector 161 is connected to an end of second gate pull-up electrode 123 in first half-bridge cell 154.

Second gate pull-up electrode connector 162 is disposed above second gate electrode lead wire connector 158 through via hole 160. Second gate pull-up electrode connector 162 is connected to an end of first gate pull-up electrode 122 in third half-bridge cell 156.

Figure 19A:
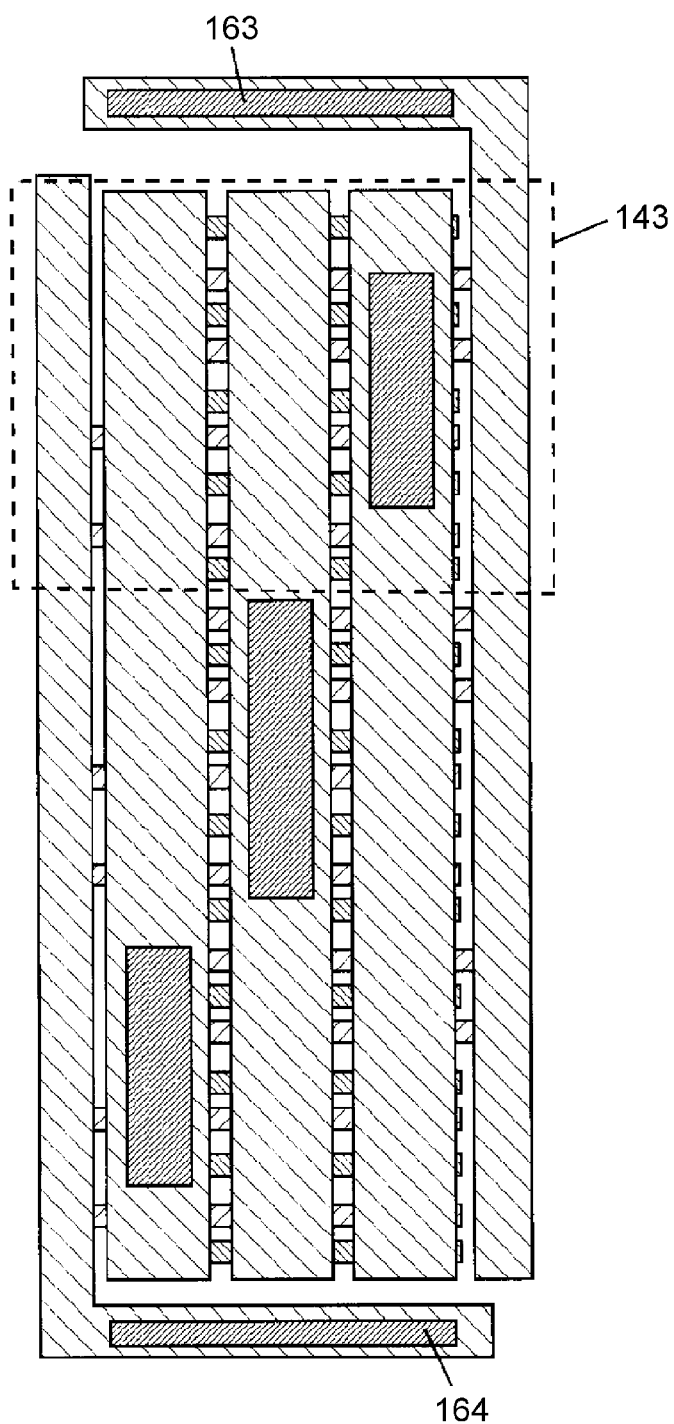
FIG. 19A is a device layout diagram showing the variation of the semiconductor device according to the second exemplary embodiment.

As shown in FIG. 19A, via hole 163 is disposed on first gate pull-up electrode connector 161. Via hole 164 is disposed on second gate pull-up electrode connector 162.

Figure 19B:
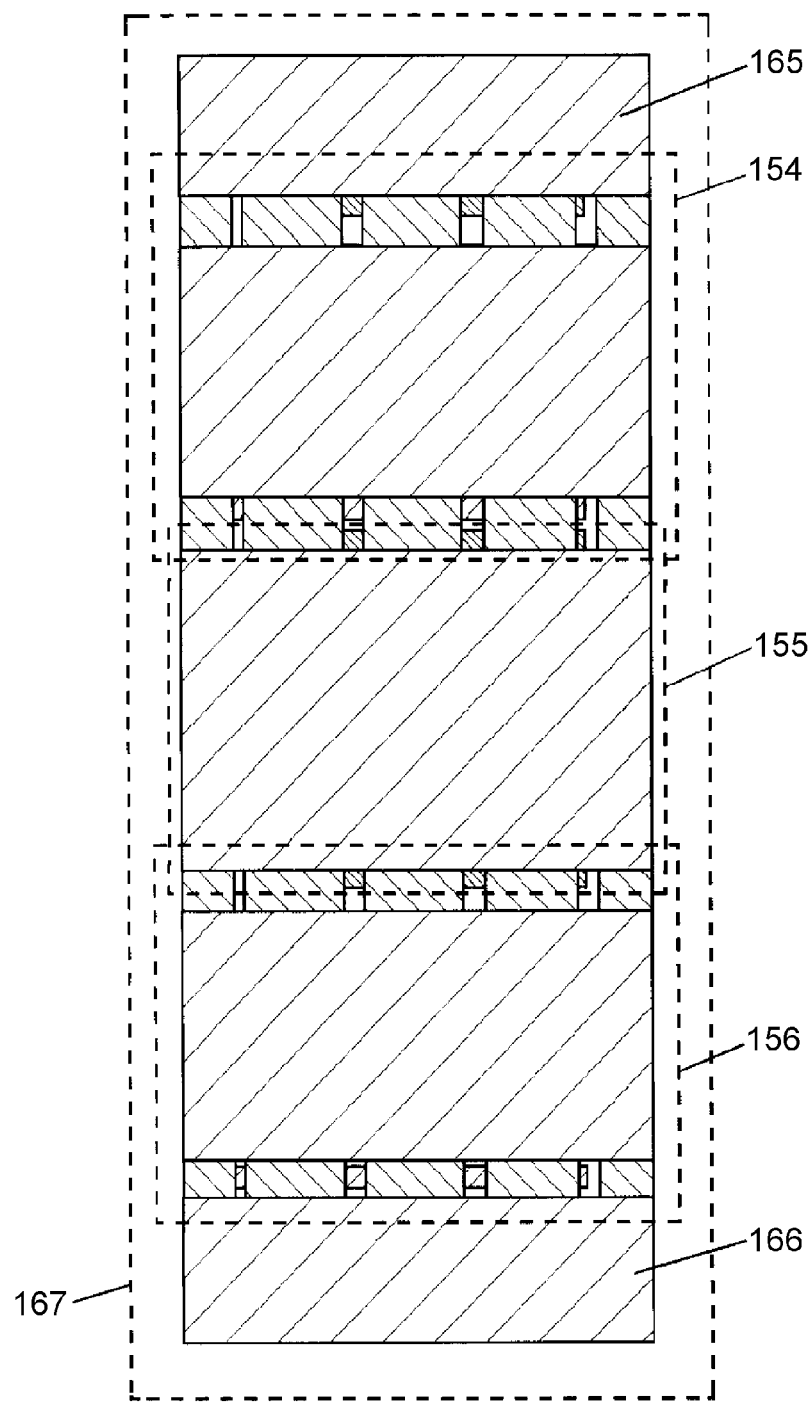
FIG. 19B is a device layout diagram showing the variation of the semiconductor device according to the second exemplary embodiment.

As shown in FIG. 19B, first above-connector gate electrode pad 165 is disposed above first gate pull-up electrode connector 161 through via hole 163. Second above-connector gate electrode pad 166 is disposed above second gate pull-up electrode connector 162 through via hole 164.

A layout of the above-connector gate electrode pad shown in FIG. 19B is one example. The above-connector gate electrode pad may be disposed at any position as long as it is not in contact with another electrode pad but connected to the lower gate electrode wiring through the via hole.

The layout having the three half-bridge cells shown in the variation of this exemplary embodiment is referred to as composite half-bridge cell 167.

Third Exemplary Embodiment

Hereinafter, a semiconductor device according to the third exemplary embodiment will be described with reference to the accompanying drawings.

Figure 20:
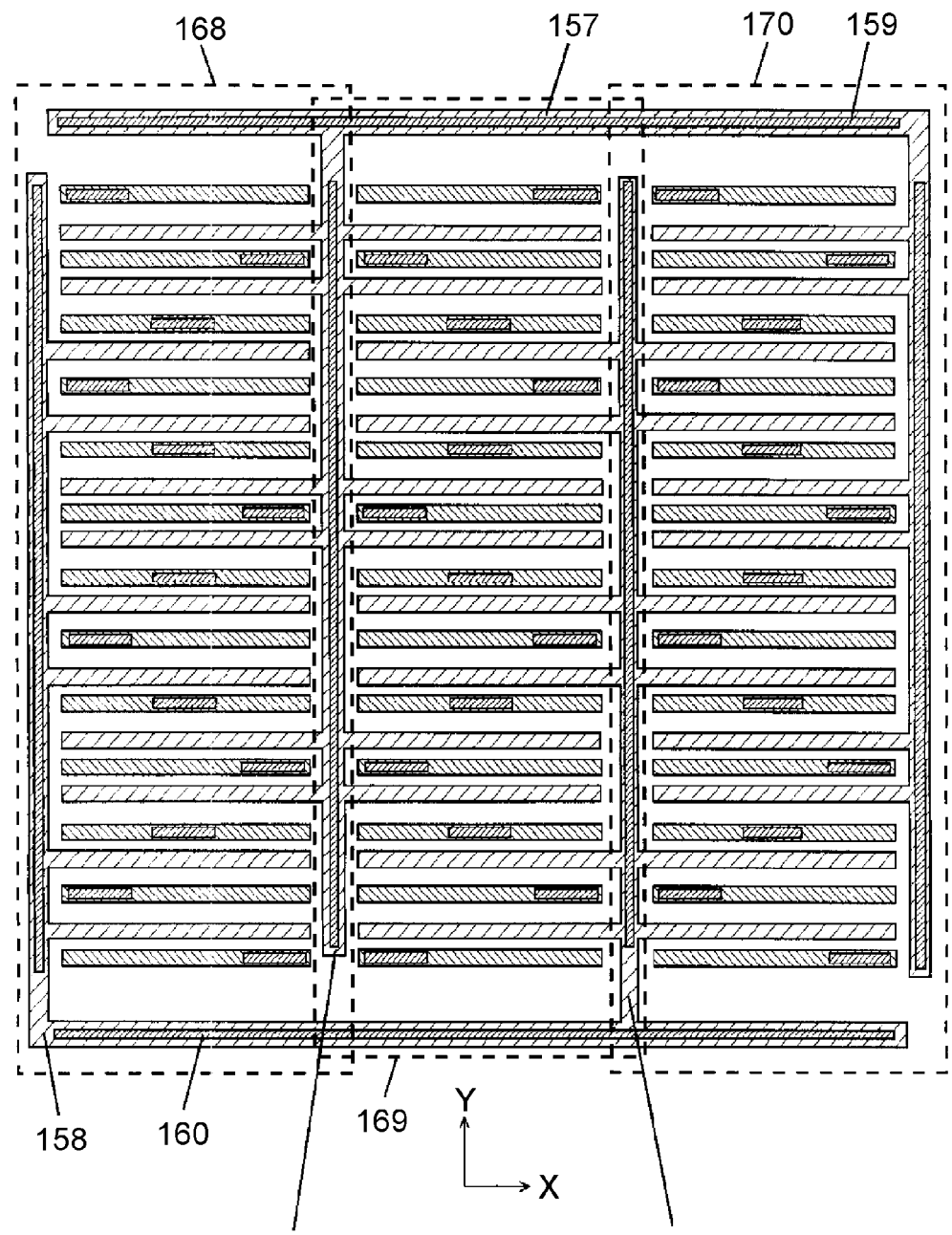
FIG. 20 is a device layout diagram of a semiconductor device according to a third exemplary embodiment.
Figure 21:
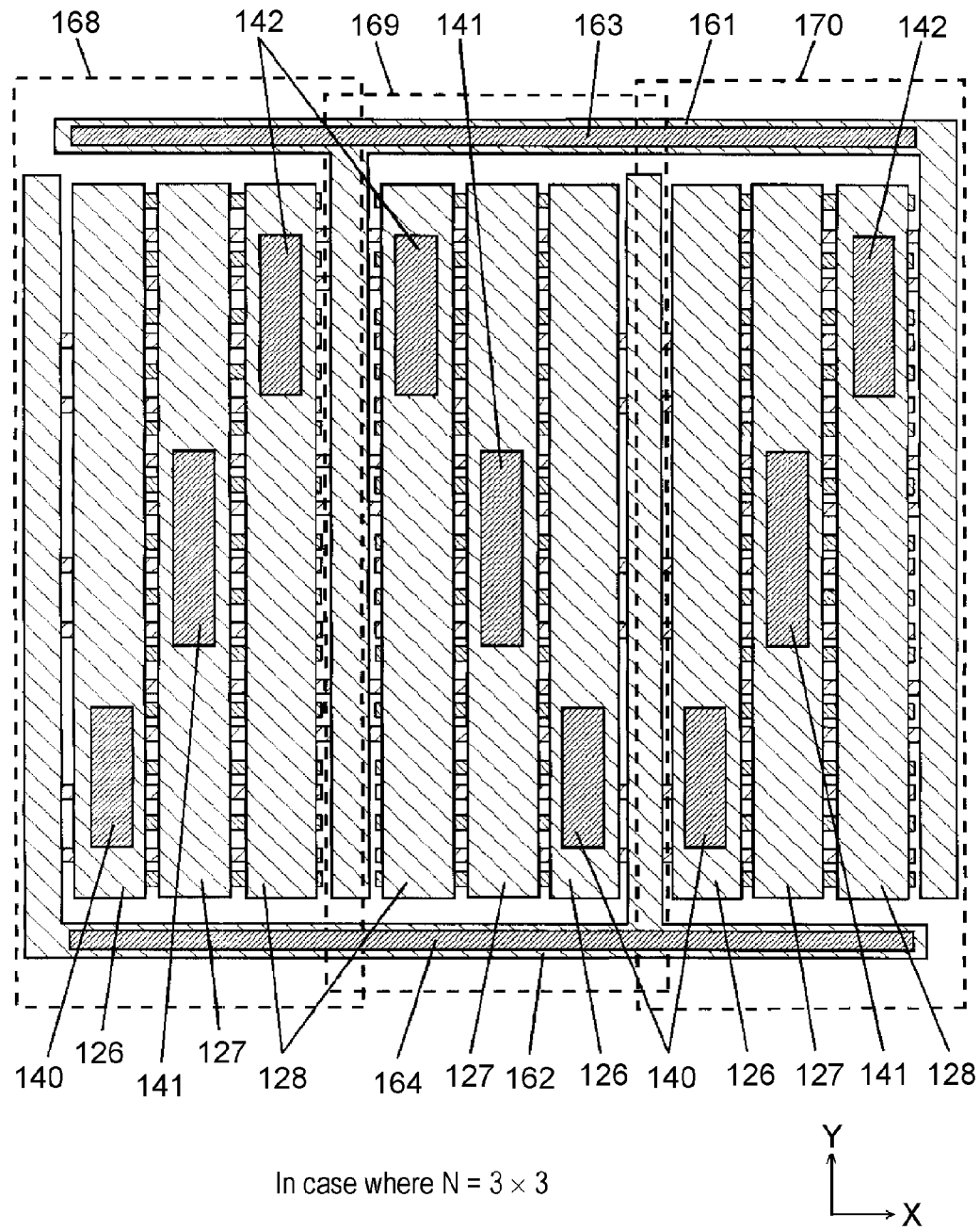
FIG. 21 is a device layout diagram of the semiconductor device according to the third exemplary embodiment.
Figure 22:
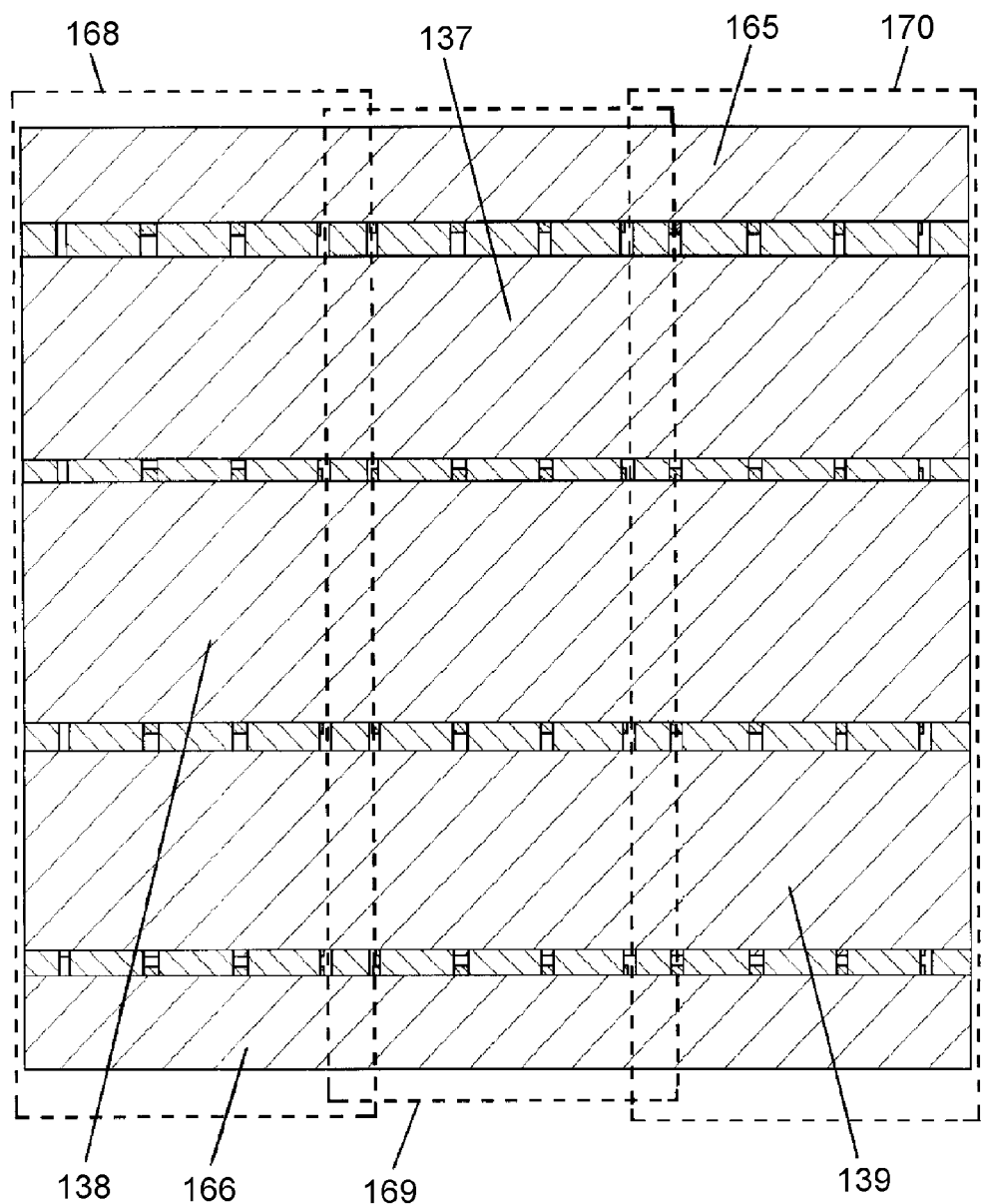
FIG. 22 is a device layout diagram of the semiconductor device according to the third exemplary embodiment.

FIGS. 20 to 23 show device layout diagrams in the semiconductor device according to this exemplary embodiment. This device serves as a field effect transistor composed of a nitride semiconductor, as one example. To make the description understandable, FIG. 20 shows a layout of a surface of the semiconductor device, FIG. 21 shows a layout of a first layer of a thick film rewiring, and FIG. 22 shows a layout of a second layer of the thick film rewiring.

First, a configuration in FIG. 20 will be described. A plurality of (N=3 in this case) composite half-bridge cells 167 shown in FIGS. 16 to 19B are disposed, more specifically, first composite half-bridge cell 168, second composite half-bridge cell 169, and third composite half-bridge cell 170 are disposed.

Since composite half-bridge cell 167 is composed of three half-bridge cells 143, the number of the half-bridge cells is such that N=3×3. The value of the number N may be combined into any number.

FIG. 20 shows the composite half-bridge cell configuration in FIG. 16, but may show the composite half-bridge cell configuration having the source electrode and the drain electrode surrounded by the gate electrodes in FIG. 17.

First gate electrode lead wire 109 in first composite half-bridge cell 168 is combined with first gate electrode lead wire 109 in second composite half-bridge cell 169. At this time, a layout structure of second composite half-bridge cell 169 is obtained by inverting the layout of first composite half-bridge cell 168 with respect to a Y axis.

Second gate electrode lead wire 119 in second composite half-bridge cell 169 is combined with second gate electrode lead wire 119 in third composite half-bridge cell 170.

The via hole and the upper layer wiring formed in an upper part on the combined gate electrode lead wire are all combined. In this case, third composite half-bridge cell 170 has the same layout structure as first composite half-bridge cell 168.

First gate electrode lead wire connector 157 in first composite half-bridge cell 168, first gate electrode lead wire connector 157 in second composite half-bridge cell 169, and first gate electrode lead wire connector 157 in third composite half-bridge cell 170 are connected.

Second gate electrode lead wire connector 158 in first composite half-bridge cell 168, second gate electrode lead wire connector 158 in second composite half-bridge cell 169, and second gate electrode lead wire connector 158 in third composite half-bridge cell 170 are connected.

Via hole 159 in first composite half-bridge cell 168, via hole 159 in second composite half-bridge cell 169, and via hole 159 in third composite half-bridge cell 170 are connected.

Via hole 160 in first composite half-bridge cell 168, via hole 160 in second composite half-bridge cell 169, and via hole 160 in third composite half-bridge cell 170 are connected.

As shown in FIG. 21, first gate pull-up electrode connector 161 in first composite half-bridge cell 168, first gate pull-up electrode connector 161 in second composite half-bridge cell 169, and first gate pull-up electrode connector 161 in third composite half-bridge cell 170 are connected.

Second gate pull-up electrode connector 162 in first composite half-bridge cell 168, second gate pull-up electrode connector 162 in second composite half-bridge cell 169, and second gate pull-up electrode connector 162 in third composite half-bridge cell 170 are connected.

Via hole 163 in first composite half-bridge cell 168, via hole 163 in second composite half-bridge cell 169, and via hole 163 in third composite half-bridge cell 170 are connected.

Via hole 164 in first composite half-bridge cell 168, via hole 164 in second composite half-bridge cell 169, and via hole 164 in third composite half-bridge cell 170 are connected.

As shown in FIG. 22, first drain electrode pad 139 is disposed on via hole 140 disposed on first drain pull-up electrode 126 in each composite half-bridge cell.

First drain and source common electrode pad 138 is disposed on via hole 141 disposed on first drain and source common pull-up electrode 127.

First source electrode pad 137 is disposed on via hole 142 disposed on first source pull-up electrode 128.

First above-connector gate electrode pad 165 is disposed on via hole 163 disposed on first gate pull-up electrode connector 161.

Second above-connector gate electrode pad 166 is disposed on via hole 164 disposed on second gate pull-up electrode connector 162.

As shown in FIG. 22, there are one first drain electrode pad 139, one first drain and source common electrode pad 138, and one first source electrode pad 137.

Figure 23:
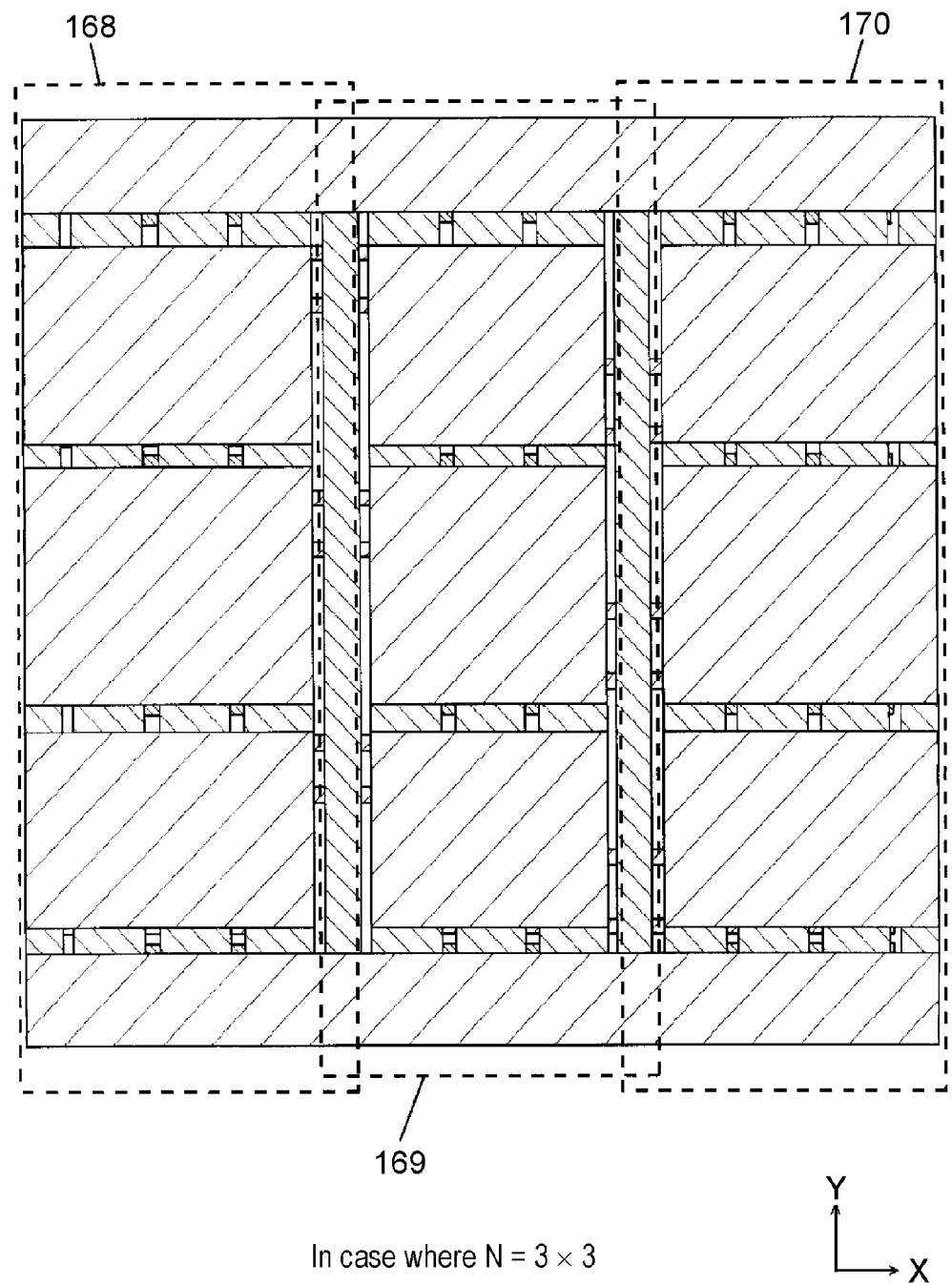
FIG. 23 is a device layout diagram of the semiconductor device according to the third exemplary embodiment.

Furthermore, as shown in FIG. 23, each electrode pad may be divided into plural parts.

Figure 24:
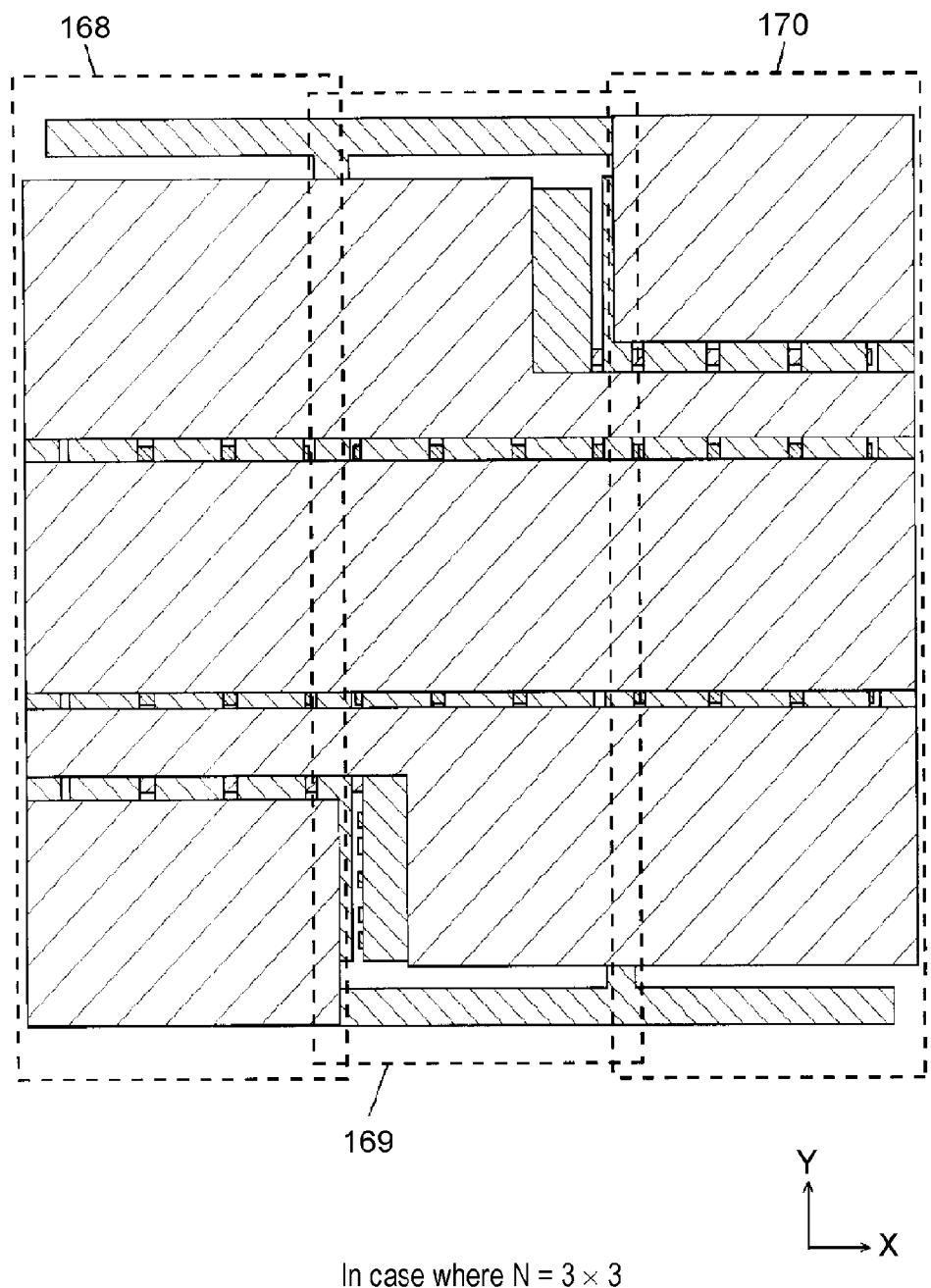
FIG. 24 is a device layout diagram showing a variation of the semiconductor device according to the third exemplary embodiment.

Furthermore, FIG. 24 shows a layout variation of the electrode pads of an uppermost layer. In the case of the layout shown in FIG. 23, a line width of each gate electrode pad in the Y direction is small, so that it is difficult to perform wire bonding or flip chip bonding.

Thus, in order to sufficiently ensure the line width of each gate electrode pad in the Y direction, the gate electrode pad has a configuration shown in FIG. 24. A line width of each gate electrode pad in the X direction can be reduced, so that a line width of the drain electrode pad and the source electrode pad in the Y direction can be increased by an amount corresponding to the above reduced width. With this configuration, inductances parasitic in the drain electrode and the source electrode can be reduced.

Furthermore, as shown in FIG. 24, additional pads each having a small line width in the Y direction are preferably formed from first drain electrode pad 139 and source electrode pad 137, in a region between first above-connector gate electrode pad 165 and first drain and source common electrode pad 138, and a region between second above-connector gate electrode pad 166 and first drain and source common electrode pad 138, respectively. With this configuration, the inductances parasitic in the drain electrode and the source electrode can be further reduced.

Figure 25:
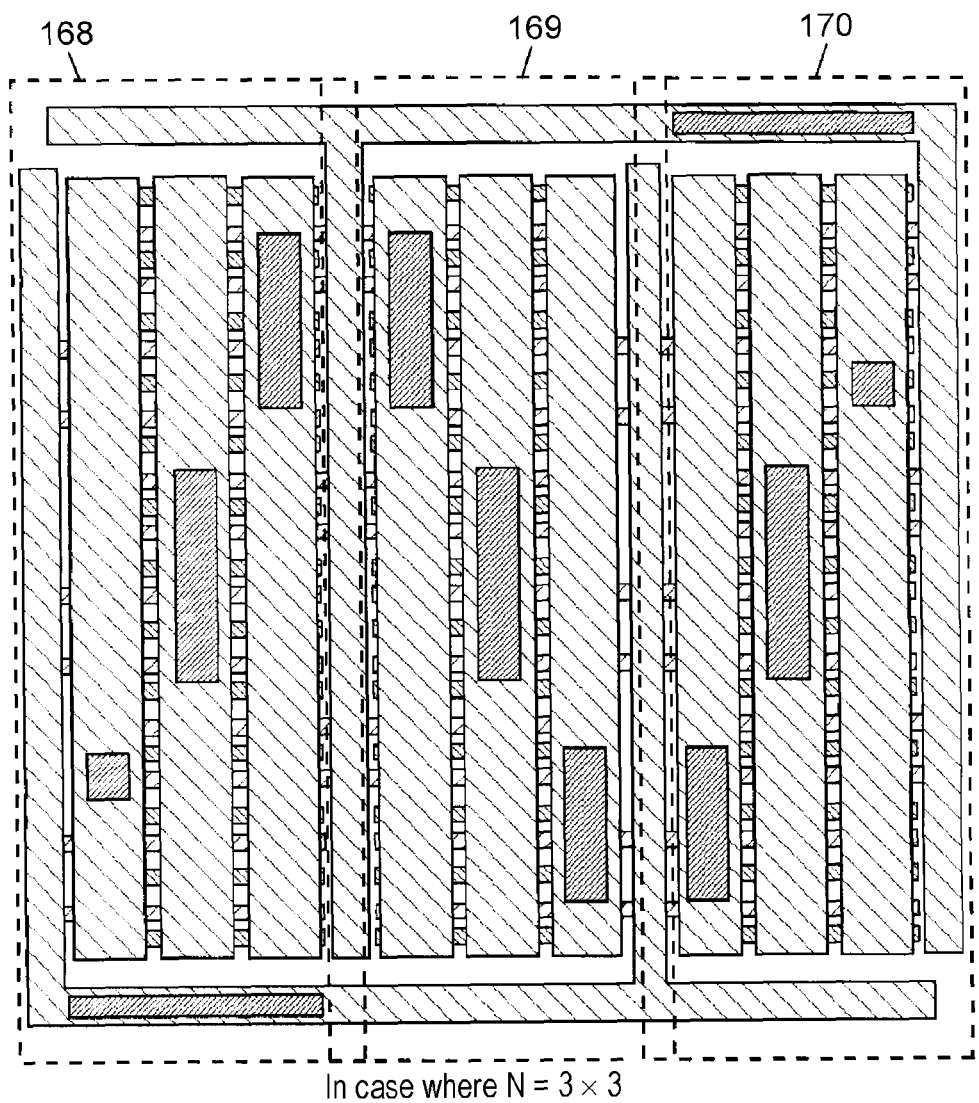
FIG. 25 is a device layout diagram showing a variation of the semiconductor device according to the third exemplary embodiment.

FIG. 25 shows an arrangement layout of via holes under the electrode pads of the uppermost layer shown in FIG. 24. The layout other than the via hole arrangement is the same as that in FIG. 21. The via holes are disposed under the electrode pad so as not protrude from the electrode pad.

Fourth Exemplary Embodiment

The first to third exemplary embodiments each show the layout structure in which a gate width of the high-side transistor is the same as that of the low-side transistor in the DC-DC converter. As a matter of course, the gate width of the high-side transistor may be different from that of the low-side transistor as needed. This exemplary embodiment shows one example of a layout in which the gate width of the low-side transistor is larger than the gate width of the high-side transistor.

Figure 26:
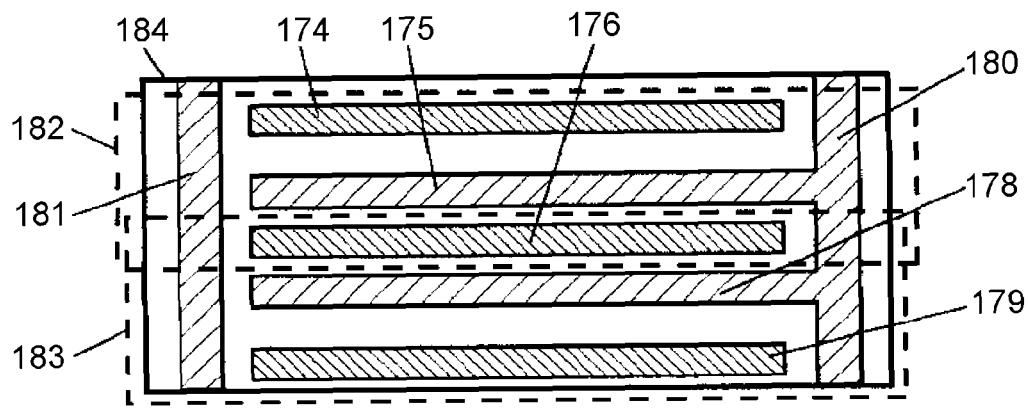
FIG. 26 is a layout diagram of a low-side transistor cell included in a semiconductor device according to a fourth exemplary embodiment.

FIG. 26 shows a layout of only the low-side transistors. Third low-side transistor 182 is comprised of third drain electrode 174, third source electrode 176, and fifth gate electrode 175 disposed between third drain electrode 174 and third source electrode 176.

Fourth low-side transistor 183 is comprised of third source electrode 176, fourth drain electrode 179, and sixth gate electrode 178 disposed between third source electrode 176 and fourth drain electrode 179.

Third source electrode 176 is shared by third low-side transistor 182 and fourth low-side transistor 183.

Fifth gate electrode 175 and sixth gate electrode 178 are connected to third gate electrode lead wire 180. Third low-side transistor 182 and fourth low-side transistor 183 are collectively referred to as additional low-side transistor cell 184.

Figure 27:
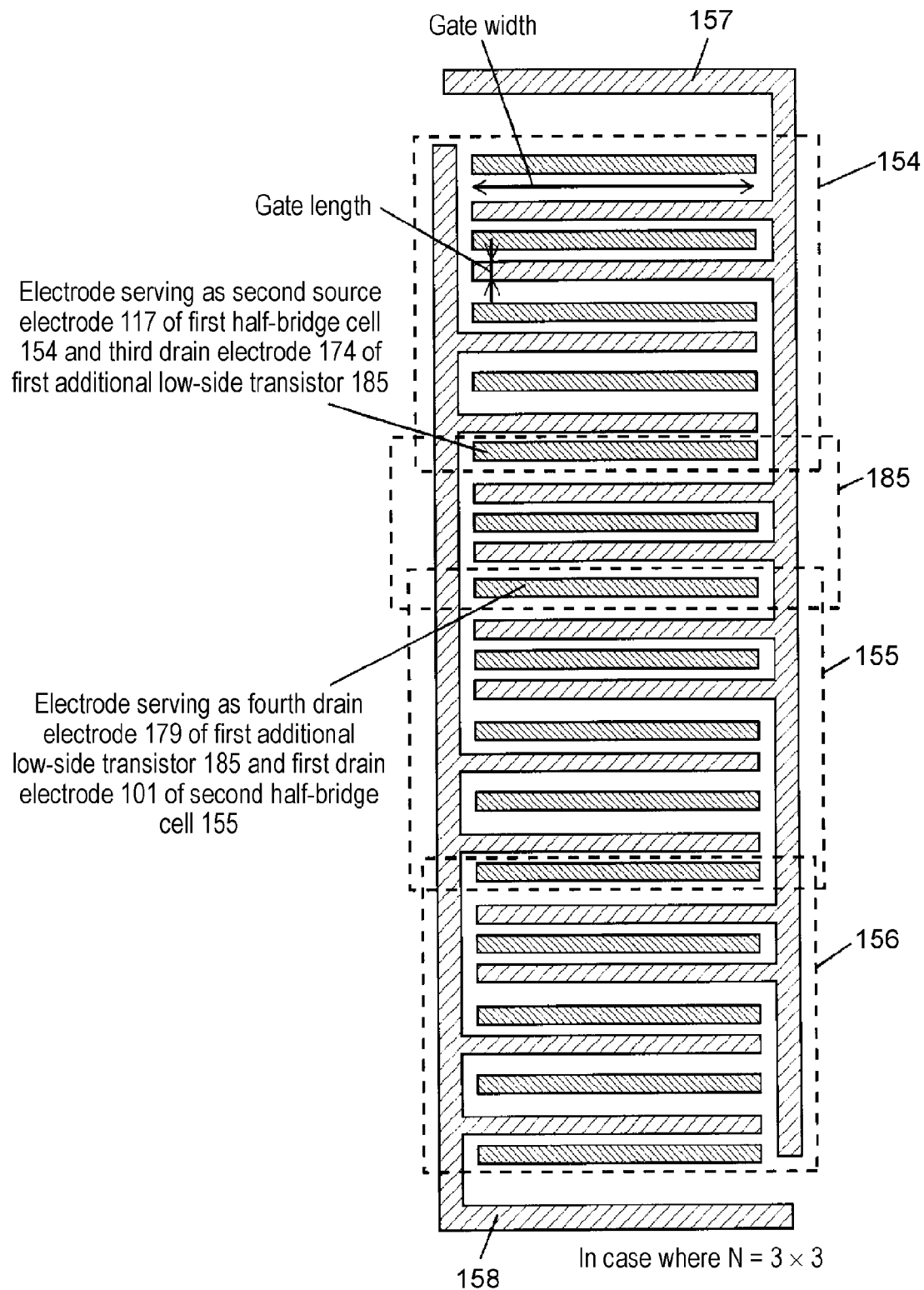
FIG. 27 is a device layout diagram of the semiconductor device according to the fourth exemplary embodiment.

In the layout configuration in the case where N=3 in FIG. 16, the gate width of the high-side transistor is equal to the gate width of the low-side transistor. However, as shown in FIG. 27, first additional low-side transistor cell 185 is inserted between first half-bridge cell 154 and second half-bridge cell 155.

Second source electrode 117 in first half-bridge cell 154 is combined with third drain electrode 174 in first additional low-side transistor cell 185. In addition, fourth drain electrode 179 in first additional low-side transistor cell 185 is combined with first drain electrode 101 in second half-bridge cell 155.

Third gate electrode lead wire 180 is connected to first gate electrode lead wire 109, and fourth gate electrode lead wire 181 is connected to second gate electrode lead wire 119.

With this configuration, the gate width of the low-side transistor is larger than the gate width of the high-side transistor. The gate width of the transistor means a total width of the gate electrodes. Therefore, by adding the cell having the low-side transistor only, the total gate width of the low-side transistor becomes larger than the total gate width of the high-side transistor.

Whatever value the N takes, additional low-side transistor cell 184 is to be inserted as needed between half-bridge cells 143 so that each transistor satisfies a desired value. In addition, in a case where the gate width of the high-side transistor is to be larger than the gate width of the low-side transistor, an additional high-side transistor cell is inserted similarly.

According to this exemplary embodiment, a source field plate connected to the source electrode may be disposed on gate electrode with a dielectric layer made of SiN interposed between them in order to relax an electric field to reduce gate-drain capacity Cds.

In this exemplary embodiment, any value may be applied to a gate electrode length (Lg), a source electrode length (Ls), a drain electrode length (Ld), a distance (Lgs) between the gate electrode and the source electrode, a distance (Lgd) between the gate electrode and the drain electrode, and the gate width (Wg) as long as the value does not depart from the scope of the present technology.

Furthermore, the metal wiring is described only in the first exemplary embodiment, but a similar configuration may be used in another exemplary embodiment.

Any value may be applied to each of the thicknesses of the electrode and the wiring, and the thickness of the dielectric layer as long as the value does not depart from the scope of the present technology.

Furthermore, the thick film rewiring layer has the two layers in this exemplary embodiment, but it may have the two or more wiring layers.

Furthermore, according to this exemplary embodiment, the power semiconductor element may be, other than the FET made of AlGaN/GaN, an FET made of Si, an FET made of SiC, an FET made of SiGe or SiGeC, and an FET made of a group III-V compound such as GaAs or AlGaAs.

Furthermore, according to this exemplary embodiment, the compositions of AlGaN and GaN can be appropriately selected. In addition, the FET may be a hetero junction field effect transistor (HFET), a junction field effect transistor (JFET), a metal-oxide semiconductor field effect transistor (MOSFET), or a metal-insulator semiconductor field effect transistor (MISFET) other than the above-described FET.

Furthermore, the power semiconductor element may be a bipolar transistor such as insulated gate bipolar transistor (IGBT) other than the FET.

The present technology may include various variations that the person skilled in the art can easily come up with, and combine a component in a different exemplary embodiment as long as they do not depart from the scope of the present technology.

"The combined source electrode" in the present technology corresponds to first source electrode 103 in the above exemplary embodiment. Furthermore, "the combined drain electrode" in the present technology corresponds to second drain electrode 113 in the above exemplary embodiment.

The semiconductor device according to the present technology can reduce a power loss caused by a parasitic inductance due to the inner device structure of the power semiconductor element, and improve power conversion efficiency in a power conversion circuit such as the DC-DC converter.

What is claimed is:

1. A semiconductor device comprising:
    a semiconductor layer laminate disposed on a semiconductor substrate;
    a first low-side transistor disposed on the semiconductor layer laminate, and having a gate electrode, a source electrode, and a drain electrode;
    a second low-side transistor disposed on the semiconductor layer laminate, and having a gate electrode, a source electrode, and a drain electrode;
    a first high-side transistor disposed on the semiconductor layer laminate, and having a gate electrode, a source electrode, and a drain electrode; and
    a second high-side transistor disposed on the semiconductor layer laminate, and having a gate electrode, a source electrode, and a drain electrode,
    wherein the second low-side transistor is disposed between the first low-side transistor and the first high-side transistor,
    the first high-side transistor is disposed between the second low-side transistor and the second high-side transistor,
    the source electrode of the first low-side transistor and the source electrode of the second low-side transistor are combined into one common source electrode,
    the drain electrode of the first high-side transistor and the drain electrode of the second high-side transistor are combined into one common drain electrode, and
    the drain electrode of the second low-side transistor and the source electrode of the first high-side transistor are combined into one common first electrode.

2. The semiconductor device according to claim 1, further comprising:
    a first gate electrode lead wire; and
    a second gate electrode lead wire,
    wherein a first gate electrode serving as the gate electrode of the first low-side transistor, and a second gate electrode serving as the gate electrode of the second low-side transistor are connected to the first gate electrode lead wire, and
    a third gate electrode serving as the gate electrode of the first high-side transistor, and a fourth gate electrode serving as the gate electrode of the second high-side transistor are connected to the second gate electrode lead wire.

3. The semiconductor device according to claim 2,
    wherein the first gate electrode, the second gate electrode, the third gate electrode, and the fourth gate electrode are each disposed so as to extend in a first direction,
    the first gate electrode lead wire and the second gate electrode lead wire are each disposed so as to extend in a second direction, and
    the first direction intersects with the second direction at right angles.

4. The semiconductor device according to claim 3, further comprising:
    a first dielectric layer disposed on the semiconductor layer laminate;
    a first gate pull-up electrode and a second gate pull-up electrode each disposed on the first dielectric layer;
    a first common pull-up electrode to the drain and the source electrodes disposed on the first dielectric layer and disposed between the first gate pull-up electrode and the second gate pull-up electrode;
    a first drain pull-up electrode disposed on the first dielectric layer, and disposed between the first gate pull-up electrode and the first common pull-up electrode to the drain and the source electrodes; and
    a first source pull-up electrode disposed on the first dielectric layer, and disposed between the second gate pull-up electrode and the first common pull-up electrode to the drain and the source electrodes,
    wherein the first drain pull-up electrode is connected to the drain electrode of the first low-side transistor through a first via hole, and connected to the combined common drain electrode through a second via hole,
    the first source pull-up electrode is connected to the combined common source electrode through a third via hole, and connected to the source electrode of the second high-side transistor through a fourth via hole,
    the first common pull-up electrode to the drain and the source electrodes is connected to the first electrode through a fifth via hole,
    the first gate pull-up electrode is connected to the first gate electrode lead wire through a sixth via hole, and the second gate pull-up electrode is connected to the second gate electrode lead wire through a seventh via hole.

5. The semiconductor device according to claim 4, further comprising:
a second dielectric layer disposed on each of the pull-up electrodes;
a first gate electrode pad disposed on the second dielectric layer, and connected to the first gate pull-up electrode through an eighth via hole;
a second gate electrode pad disposed on the second dielectric layer, and connected to the second gate pull-up electrode through a ninth via hole;
a first drain electrode pad disposed on the second dielectric layer, and connected to the first drain pull-up electrode through a tenth via hole;
a first drain and source common electrode pad disposed on the second dielectric layer, and connected to the first common pull-up electrode to the drain and the source electrodes through an eleventh via hole; and
a first source electrode pad disposed on the second dielectric layer, and connected to the first source pull-up electrode through a twelfth via hole,
wherein the first gate electrode pad and the second gate electrode pad are each disposed so as to extend in the second direction, and
the first drain electrode pad, the first drain and source common electrode pad, and the first source electrode pad are each disposed so as to extend in the first direction.

6. The semiconductor device according to claim 5,
wherein the eighth via hole wholly overlaps with the first gate electrode pad in a plan view,
the ninth via hole wholly overlaps with the second gate electrode pad in a plan view,
the tenth via hole wholly overlaps with the first drain pull-up electrode in a plan view,
the eleventh via hole wholly overlaps with the first common pull-up electrode to the drain and the source electrodes in a plan view, and
the twelfth via hole wholly overlaps with the first source pull-up electrode in a plan view.

7. The semiconductor device according to claim 5, further comprising a third dielectric layer disposed on the first source electrode pad, the first drain and source common electrode pad, and the first drain electrode pad,
wherein a first opening, a second opening, and a third opening are provided in the third dielectric layer,
the first opening wholly overlaps with the first source electrode pad in a plan view,
the second opening wholly overlaps with the first drain and source common electrode pad in a plan view, and
the third opening wholly overlaps with the first drain electrode pad in a plan view.

8. The semiconductor device according to claim 4,
wherein the first via hole and the second via hole each wholly overlap with the first drain pull-up electrode in a plan view,
the third via hole and the fourth via hole each wholly overlap with the first source pull-up electrode in a plan view,
the fifth via hole wholly overlaps with the first common pull-up electrode to the drain and the source electrodes in a plan view.

9. The semiconductor device according to claim 2,
wherein the source electrode combined with the source electrode of the first low-side transistor and the source electrode of the second low-side transistor as one electrode is tightly surrounded by the first gate electrode, the second gate electrode, and the first gate electrode lead wire in a plan view, and
the drain electrode combined with the drain electrode of the first high-side transistor and the drain electrode of the second high-side transistor as one common electrode is tightly surrounded by the third gate electrode, the fourth gate electrode, and the second gate electrode lead wire in a plan view.

10. The semiconductor device according to claim 1, further comprising:
a first half-bridge cell; and
a second half-bridge cell adjacent to the first half-bridge cell,
wherein each of the first and second half-bridge cells includes the first low-side transistor, the second low-side transistor, the first high-side transistor, and the second high-side transistor, and
the source electrode of the first half-bridge cell is combined with the drain electrode of the second half-bridge cell to be common thereto.

11. The semiconductor device according to claim 10,
wherein the first gate electrode and the second gate electrode in each of the first and second half-bridge cells are connected to each other at ends on a side opposite to the first gate electrode lead wire, and
the third gate electrode and the fourth gate electrode in each of the first and second half-bridge cells are connected to each other at ends on a side opposite to the second gate electrode lead wire.

12. The semiconductor device according to claim 1, further comprising:
a first half-bridge cell;
a second half-bridge cell;
a third low-side transistor disposed between the first half-bridge cell and the second half-bridge cell; and
a fourth low-side transistor disposed between the third low-side transistor and the second half-bridge cell,
wherein each of the first and second half-bridge cells includes the first low-side transistor, the second low-side transistor, the first high-side transistor, and the second high-side transistor,
a source electrode of the first half-bridge cell and a drain electrode of the third low-side transistor are combined into one common electrode,
a source electrode of the third low-side transistor and a source electrode of the fourth low-side transistor are combined into one common electrode, and
the drain electrode of the third low-side transistor and the drain electrode of the second half-bridge cell are combined into one common electrode.

13. The semiconductor device according to claim 1,
wherein the semiconductor device is made of a nitride semiconductor.

14. The semiconductor device according to claim 1, further comprising a p-type semiconductor layer disposed between each of the gate electrodes and the semiconductor layer laminate.

* * * * *